United States Patent
Lesso

(10) Patent No.: US 11,880,728 B2
(45) Date of Patent: Jan. 23, 2024

(54) COMPUTING CIRCUITRY

(71) Applicant: Cirrus Logic International Semiconductor Ltd., Edinburgh (GB)

(72) Inventor: John Paul Lesso, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 0 days.

(21) Appl. No.: 18/296,297

(22) Filed: Apr. 5, 2023

(65) Prior Publication Data
US 2023/0244881 A1   Aug. 3, 2023

Related U.S. Application Data

(63) Continuation of application No. 17/947,423, filed on Sep. 19, 2022, now Pat. No. 11,651,168, which is a
(Continued)

(30) Foreign Application Priority Data

Jul. 11, 2019   (GB) .................................. 1909971

(51) Int. Cl.
*G06G 7/00*   (2006.01)
*G06G 7/48*   (2006.01)
(Continued)

(52) U.S. Cl.
CPC .............. *G06G 7/48* (2013.01); *G06N 3/065* (2023.01); *H02M 1/0845* (2013.01); *H03M 1/06* (2013.01); *H03M 1/12* (2013.01)

(58) Field of Classification Search
CPC ....... G06G 7/48; G06N 3/065; H02M 1/0845; H03M 1/06; H03M 1/12
See application file for complete search history.

(56) References Cited

U.S. PATENT DOCUMENTS

| | | | | |
|---|---|---|---|---|
| 8,860,595 | B1* | 10/2014 | Fan ..................... | H02M 7/02 323/298 |
| 2015/0365097 | A1 | 12/2015 | Jadus | |
| 2019/0042199 | A1 | 2/2019 | Sumbul et al. | |

FOREIGN PATENT DOCUMENTS

EP   3370145 A1   9/2018

OTHER PUBLICATIONS

Combined Search and Examination Report under Sections 17 and 18(3), UKIPO, Application No. GB1909971.2, dated Jan. 14, 2020.

* cited by examiner

*Primary Examiner* — Joseph J Lauture
(74) *Attorney, Agent, or Firm* — Jackson Walker L.L.P

(57) ABSTRACT

This application relates to computing circuitry, and in particular to analogue computing circuitry suitable for neuromorphic computing. An analogue computation unit for processing data is supplied with a first voltage from a voltage regulator which is operable in a sequence of phases to cyclically regulate the first voltage. A controller is configured to control operation of the voltage regulator and/or the analogue computation unit, such that the analogue computation unit processes data during a plurality of compute periods that avoid times at which the voltage regulator undergoes a phase transition which is one of a predefined set of phase transitions between defined phases in said sequence of phases. This avoids performing computation operations during a phase transition of the voltage regulator that could result in a transient or disturbance in the first voltage, which could adversely affect the computing.

20 Claims, 9 Drawing Sheets

Related U.S. Application Data continuation of application No. 16/859,298, filed on Apr. 27, 2020, now Pat. No. 11,501,092.

(60) Provisional application No. 62/844,339, filed on May 7, 2019.

(51) Int. Cl.
*H02M 1/084* (2006.01)
*H03M 1/06* (2006.01)
*H03M 1/12* (2006.01)
*G06N 3/065* (2023.01)

COMPUTING CIRCUITRY

The present disclosure is a continuation of U.S. Non-Provisional patent application Ser. No. 17/947,423, which is a continuation of U.S. Non-Provisional patent application Ser. No. 16/859,298, filed Apr. 27, 2020, issued as U.S. patent Ser. No. 11/501,092 on Nov. 15, 2022, which claims priority to U.S. Provisional Patent Application No. 62/844,339, filed May 7, 2019, and United Kingdom Patent Application No. 1909971.2, filed Jul. 11, 2019, each of which is incorporated by reference herein in its entirety.

FIELD OF DISCLOSURE

This field of representative embodiments of this disclosure relates to methods, apparatus and/or implementations concerning or relating to computing circuitry, and in particular to methods and apparatus for operation and power management for computing circuitry.

BACKGROUND

Artificial neural networks (ANNs) are increasingly being proposed for use in a number of different areas, e.g. for classification or recognition purposes. An ANN typically comprises a number of processing nodes or artificial neurons. Each processing node can receive a plurality of data inputs and generate an output based on a weighted combination of the data inputs and a transfer function. Typically the processing nodes may be arranged in layers and the output of a processing node of one layer may be provided to one or more processing nodes of a succeeding layer.

In order to perform a particular task, the ANN is trained using a training data set during a learning or training stage, where training data is supplied to the ANN, and weightings, applied by individual neurons or nodes of the network to their inputs, are adjusted based on the task being performed. By comparing the resultant outputs with the known training data set, and repeating them over a series of iterations, the neural network learns what are the optimum weighting factor values to apply to the inputs. The goal is to determine a set of overall weights such that input data that is known to correspond to a particular defined class is correctly identified as belonging to that class and input data known not to correspond to that defined class is not incorrectly identified as such. The training stage requires a significant amount of processing to accurately determine the best weights to use for the task being performed. The ANN is thus typically trained in a centralised way in a suitable computing facility, e.g. a high performance server or the like.

Once trained, the ANN can be used during an inference process with newly acquired data, e.g. for classification or recognition purposes. The learned weights may be supplied together with an inference engine or system, which is subsequently arranged to receive operational data and for the constituent neurons to apply the programmed weights to their data inputs and provide the system outputs.

In at least some approaches, the inference stage is performed by centralised servers or "in the cloud", i.e. the trained ANN may be hosted on a centrally accessible computing facility and may receive data inputs from remote devices, such as so-called "edge" devices, e.g. mobile phones, tablet computers, "smart" devices, etc. For example, to allow for a user of a device such as a smartphone to instruct internet search queries by voice, the speech of the user could be captured by the smartphone and the relevant audio transmitted, possibly after some initial processing to extract features of interest, to an ANN trained for speech recognition which is hosted on a data centre. The ANN can then perform inference on the received audio.

However, in at least some instances, it may be desirable to implement the ANN for inference locally, i.e. in the edge device operated by the user.

Processing data using a trained ANN, i.e. performing inference, may involve significant computation. For an ANN, the input to each processing node is a typically a vector of input variables, and the input vector may have a relatively large number of elements. For at least some ANNs the processing in each processing node effectively involves multiplying the input vector by a matrix of stored weights and then combining the processed results into an output vector. The matrix of stored weights may have a large number of elements, which need to be stored in memory, and the matrix multiplication will involve a large number of calculations. Implementing a trained ANN with a digital processor based on the Von Neumann architecture would involve the weight values being stored in memory. Performing the computation associated with operating the ANN for inference would thus involve a large number of individual calculations, with memory reads to retrieve the relevant weight value and memory writes to store the result of the individual calculations. The computation would, in general be sequential in each processor core. This means that there may be some computational latency associated with performing the computations necessary for operating the ANN. In some applications, for instance for voice recognition, such latency may be undesirable.

Additionally, especially for portable devices, low power consumption is generally desirable. This is particularly the case where the computing may be performed as part of some function that is provided relatively continuously over a long timescale. For example it may be desirable to allow for an electronic device to be operable in a mode to respond to voice commands issued at any time, without requiring the user to physically interact with the device in any way beforehand. Such "always-on" functionality requires a microphone of the device to be active and for audio detected by the microphone to be analysed, in a substantially continuous manner, to detect any voice activity. The analysis may involve at least some processing of the audio signal which may involve significant computation, e.g. inference to detect whether a defined trigger word or phrase was spoken and/or to determine whether the voice activity corresponds to a registered user of the device. Implementing such processing using a conventional digital processor may require a digital processing chip to be active relatively continuously, which may result in an undesirable amount of power consumption.

SUMMARY

Embodiments of the present disclosure thus relate to methods, apparatus and systems for computing that at least mitigate at least some of the above mentioned issues.

Accordingly, in one aspect there is provided computing circuitry, comprising:
  an analogue computation unit for processing data;
  a voltage regulator configured to supply a first voltage to the analogue computation unit and operable in a sequence of phases to cyclically regulate the first voltage; and
  a controller configured to control operation of the voltage regulator and/or operation of the analogue computation unit such that the analogue computation unit processes data during a plurality of compute periods that avoid times at which the voltage regulator undergoes a phase transition which is one of a predefined set of phase transitions between defined phases in the sequence of phases.

The controller may, in some examples, be configured to control operation of the analogue computation unit to suspend the analogue computation unit from processing data during a period where the voltage regulator is undergoing one of the phase transitions in the predefined set. The controller may be configured to control operation of the analogue computation unit to start and end a compute period during at least one phase of the sequence of phases. In some examples the controller may be configured to control operation of the analogue computation unit to start and end a compute period during each one of the sequence of phases. In some examples however the controller may be configured to control operation of the analogue computation unit so that there are no compute periods when the voltage regulator is in at least one predefined phase of the sequence of phases.

In some examples the predefined set of phase transitions may comprise all of the phase transitions between phases in the sequence of phases. In other examples the predefined set of phase transitions may not comprise all of the phase transitions between phases in said sequence of phases. In which case, the controller may be configured to control operation of the analogue computation such that at least one compute period extends over a period that includes a phase transition which is not one of the predefined set of phase transitions.

In some examples the controller may be configured to control the voltage regulator so as to suspend the voltage regulator from undergoing a phase transition in the predefined set of phase transitions so as to allow time for a compute period to be completed. The analogue computation unit may be configured to provide a computation status to the controller, indicative of whether computing may be suspended, and the controller may be configured to control operation of the voltage regulator based, at least partly, on the computation status.

In some examples the voltage regulator may be configured to provide a regulator status to the controller, indicative that the voltage regulator is undergoing or is about to undergo a phase transition in the predefined set of phase transitions, and the controller is configured to control the operation of the voltage regulator and/or the operation of the analogue computing unit based, at least partly, on said regulator status.

In some examples the controller may comprise a clocking unit configured to supply a first clock reference signal to the voltage regulator to operate the voltage regulator to cycle through the plurality of phases. The controller may be configured to operate the clocking unit to maintain the first clock reference signal at a constant signal level to suspend the voltage regulator from undergoing a phase transition.

In some examples the controller may be configured to control the voltage regulator to operate in a first mode to cyclically regulate the first voltage and in a second mode to suspend regulation of the first voltage. The controller may be further configured to control the analogue computing unit so that at least some compute periods occur when the voltage regulator is operating in the second mode. In examples where the controller includes a clocking unit, the controller may, in the second mode, operate the clocking unit to maintain the first clock reference signal provided to the voltage regulator at a constant signal level.

The controller may be configured to repeatedly control operation of the voltage regulator in the first mode during a plurality of first time periods, interspersed with operation of the voltage regulator in the second mode during a plurality of second time periods. The duration of the first time periods and the second time periods may, in some examples, be predefined. In some examples the duration of at least one of the first time periods and the second time periods is variable. In the first mode of operation of the voltage regulator, the controller may be configured to compare an indication of the magnitude of the first voltage to a first threshold and to switch to the second mode if the indication of the magnitude of the first voltage crosses the first threshold. Additionally or alternatively, in the second mode of operation of the voltage regulator, the controller may be configured to compare an indication of the magnitude of the first voltage to a second threshold and to switch to the first mode if the indication of the magnitude of the first voltage crosses the second threshold value. The first threshold value and the second threshold value may be predefined, or at least one of the first threshold value and the second threshold value may be selectively variable.

The controller may be configured to control the analogue computing unit such that there is a first compute period during a period of operation of the voltage regulator in the second mode and a second compute period during a subsequent period of operation of the voltage regulator in the second mode, wherein the first and second compute periods are interspersed with at least one period of operation of the voltage regulator in the first mode.

In some examples the analogue computation unit may comprise a compensation module configured to apply a compensation for voltage droop based on an indication of the magnitude of the first voltage.

The analogue computation unit may comprise at least one processing block for producing an output signal, in which case the compensation module may be configured to apply the compensation to the output signal from said processing block. The output signal from the processing block may, in some examples, be an analogue output signal. The analogue computation unit may comprise at least one analogue-to-digital converter configured to convert said analogue output signal to a digital output signal; and, in some examples, the compensation to the output signal may comprise a conversion gain for the analogue-to-digital converter.

The analogue computation unit may comprise at least a first processing module and a second processing module. In some examples the controller is configured to control the first processing module to process data and to control the second processing module to suspend processing of data during a first compute period, and to control the first processing module to suspend processing of data and to control the second processing module to process data during a second, different, compute period.

The voltage regulator may, in some implementations, comprises an input to receive a voltage from a battery.

The voltage regulator may comprise at least one of: a DC-DC converter; a charge pump; or a buck or boost converter.

The first voltage may comprise a supply voltage to power the analogue computation unit.

In some examples the analogue computation unit is configured to receive an input data signal vector and to perform a multiplication of the data signal vector by a matrix of weight values. In some examples the analogue computation unit may comprise at least part of an inference circuit for an artificial neural network.

The computing circuitry may be implemented as an integrated circuit.

Aspects also relate to a computing device comprising the computing circuitry of any of the variants as described herein. The computing device may be at least one of: a battery powered device; a portable device; a communications device; a smartphone; a computing device; a laptop, notebook or tablet computing device; a wearable device; a smartwatch; a voice controlled or activated device; a smart speaker; a domestic appliance.

In another aspect there is provided computing circuitry, comprising:
an analogue computation unit for processing data;
a voltage regulator configured to supply a first voltage to the analogue computation unit and operable in a first mode in a cyclic sequence of phases to regulate the first voltage; and
a controller configured to control the analogue computation unit and/or the voltage regulator so that data processing is performed during a period that does not include any instance of a predefined set of phase transitions of the voltage regulator between defined phases in said sequence of phases and that data processing is suspended during any period that includes an instance of said predefined set of phase transitions.

Unless expressly indicated to the contrary, any of the various features of the various implementations discussed herein may be implemented together with any one or more of the other described features in any and all suitable combinations.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

As noted above performing inference using an artificial neural network (ANN) is one example of an application that may involve significant computation, for instance matrix multiplication, during operation and, for which, conventional digital processing based on the Von Neumann architecture may have disadvantages in terms of processing throughput and/or power consumption.

It has been proposed that at least some of the computation associated with an ANN may be implemented using computing circuitry where computing is performed, at least partly, in the analogue domain. For instance, neuromorphic computing may use at least some analogue or mixed-signal circuitry that can implement a model of a neural system, e.g. an ANN. Neuromorphic computing circuitry has been proposed. Computing in the analogue domain, or analogue computing, may involve processing data values where at least some data values are represented by the analogue values of some electrical property, e.g. instantaneous voltage or current, or possibly average values of voltage or current over a defined time period.

Figure 1:
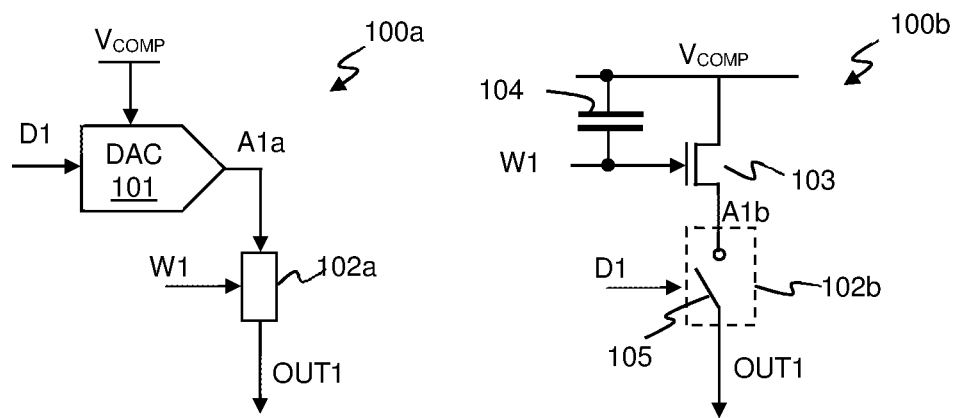
FIG. 1 illustrates two examples of circuitry for analogue computing.

For example, FIG. 1 illustrates just two examples of circuitry for generating an output indicative of the product of a first value, say an input data value D1, and a second value, say a weight value W1.

In the example circuit 100a, the input data value D1 may, for instance, be received as a digital input and converted, by a digital to analogue converter (DAC) 101, to an analogue value A1a which is supplied to a component 102a with a variable resistance or conductance. In some implementations, the analogue value output from the DAC may be a voltage value, i.e. where the voltage level represents the value of the input data D1, and the component 102a may be an element with a programmable resistance, or equivalently a programmable conductance. If the output of circuit 100a were a virtual earth, the current at the output would be proportional to the voltage of the analogue signal A1a and inversely proportional to the resistance of component 102a. Equivalently the magnitude of the output current OUT1 would be proportional to the product of the voltage and the conductance of the component 102a. The conductance of the component 102a may thus be controllably programmed to represent a desired weight value W1 and the output signal OUT1 will be a current signal with a magnitude proportional to D1*W1. The component 102a could be any suitable component with a controllably variable resistance/conductance. For some analogue computing arrangements the component 102a could comprise one or more memristors. Memristors are electronic elements that have a variable resistance which can be controllably varied and which have some memory such that a particular resistance state persists in the absence of applied power. The use of memristors can allow the computing circuit 100a to also include a memory function, e.g. for non-volatile storage of a weight value, which avoids the need for additional memory.

Circuit 100b shows an alternative arrangement. In this example a weight signal W1 is used to control transistor 103 to provide an analogue current with a magnitude that depends on the desired weight value. The weight signal may be maintained, for example, by charging capacitor 104 to a desired voltage. The analogue signal A1a, which in this instance represents the weight value, is input to component 102b which, in this example, comprises a switch 105. In this example the component 102b is thus effectively variable between a very high off-resistance and a low on-resistance. The switch 105 may be controlled to apply some time-encoding modulation to the analogue signal A1b based on the input data value D1. For instance the switch 105 may be controlled in a pulse-width-modulation (PWM) manner such that the switch passes the analogue signal A1b to the output for a proportion of a PWM cycle period based on the data value D1, and blocks supply of the analogue signal A1b during the rest of the PWM cycle period. The result is that the output signal OUT1 is a current signal where the average current over the whole of the cycle period is proportional to the input data value D1 and also proportional to the weight value encoded by the weight signal W1, i.e. the output current is proportional to D1*W1.

It will of course be appreciated that these are just two examples, and there are many other ways in which analogue computing could be implemented. For instance, referring to circuit 100a, the DAC 101 could in some implementation be a current output DAC for outputting the analogue signal A1 as a current signal. The DAC 101 could instead be replaced with a PWM switch arrangement as described with reference to circuit 100b. Some implementations may allow at least some parallel processing, for instance the analogue signal output from the DAC 101 could be applied to a plurality of components 102a in parallel, each programmed to represent a respective weight value, so as to perform parallel computation to provide the product of the same input value with each of the plurality of respective weight values. Additionally or alternatively, a plurality of circuits such as 100a or 100b could be arranged to receive different input data values. The outputs could be summed by combining the output current signals.

It will also be appreciated that some of the values may be quantised, for instance, referring to the example circuit 100a, there may be a limited number of different values of resistance/conductance that the component 102a may be programmed to. It will be understood however that the overall approach is analogue. As such, the computing circuitry may be susceptible to manufacturing tolerances and also variations in operating parameters, such as variations in any supply or reference voltages. As shown in FIG. 1, a DAC of circuit 100a may receive a first voltage, $V_{COMP}$, e.g. as a supply or reference voltage. Any variation in this received voltage $V_{COMP}$ may have an impact on the level of the analogue signal A1. Likewise the analogue signal A1 generated in circuit 100b may vary with the received voltage $V_{COMP}$. In particular any transients affecting the power supply could lead to artefacts in the computation.

Embodiments relate to apparatus and methods for computing, in particular for analogue computing, and to methods and apparatus for computing circuitry with control of computing periods with respect to operation of a power supply. Embodiments of the disclosure are suitable for operating a computing circuit, in particular a computing circuit that forms at least part of an artificial neural network (ANN) implemented, at least partly, in the analogue domain and/or a neuromorphic computing circuit.

Figure 2:
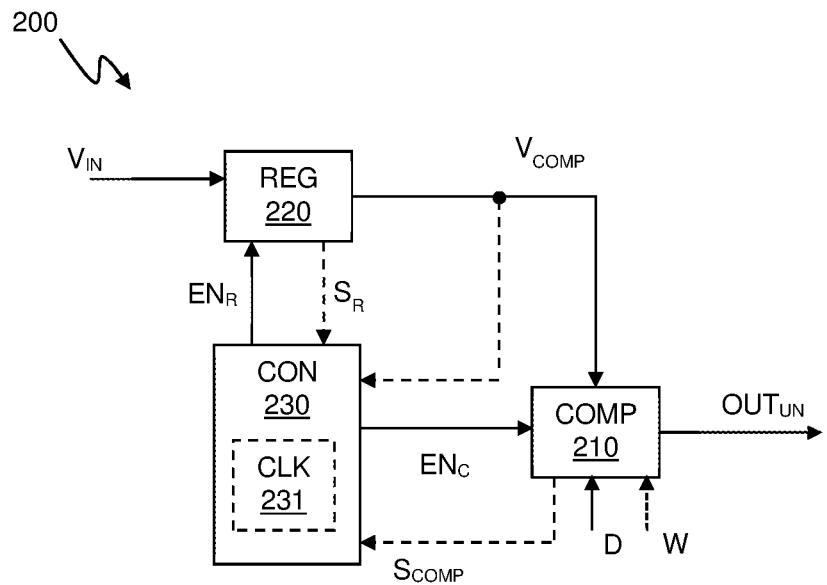
FIG. 2 illustrates one example of computing circuitry according to an embodiment.

FIG. 2 illustrates an example of computing circuitry 200 according to an embodiment. Computing circuitry 200 comprises analogue computation unit 210 configured to receive first data D and process the first data D, at least partly, in the analogue domain. In some embodiments, the first data D may comprise a data signal which is a vector of a plurality of input variables, e.g. an input vector of j input variables. The analogue computation unit 210 is configured to process the received first data with second data. In some embodiments the second data may comprise a set of weight values, for example a matrix $W_{j,k}$ of j by k weight values.

In some implementations the relevant weight values may be supplied to the analogue computation unit 210, in use, by a suitable weight signal. In some embodiments however, the analogue computation unit 210 may include a memory functionality for storing the matrix of weight values in the absence of applied power, i.e. the analogue computation unit 210 may include some non-volatile memory elements such as memristors as discussed above. The weight values may therefore be programmed into the analogue computing unit in a programming step that occurs before the analogue computing unit 210 is used for processing data, e.g. for inference.

The analogue computation unit 210 processes the first data D with the second data W to implement a desired computation and provides an output signal $OUT_{UN}$ for the computing unit. In one example the analogue computation unit 210 may be configured as a dot product engine to process the received first data vector by the weight values matrix $W_{j,k}$ and provide an output vector $OUT_k$ with k different output variables. The individual output variables could be output to provide the output $OUT_{UN}$ in parallel channels and/or in a time division manner. In some embodiments however there may be further processing, e.g. in an ANN implementation the input data variables may each be multiplied by a respective weight value and the results combined to form a weighted data combination, which is then processed according to some non-linear function such as an activation function to provide the resultant output variable. In some embodiments the analogue computation unit 210 may comprise at least part of an ANN, e.g. at least part of an inference circuit or inference engine.

The analogue computing circuitry 200 of FIG. 2 also comprises a voltage regulator 220 configured to supply at least a first voltage, $V_{COMP}$, to the analogue computation unit 210. The voltage regulator 220 may comprise any suitable apparatus, such as a DC-DC converter, for regulating a received input voltage $V_{IN}$ to provide the first voltage $V_{COMP}$. In some embodiments the voltage regulator 220 may comprise a charge pump or an inductor based DC-DC converter such as a buck converter. For low power operation of the analogue computing unit 210 the voltage regulator 220 may regulate the input voltage $V_{IN}$ to a lower magnitude voltage $V_{COMP}$ for supply to the analogue computing unit 210.

In some embodiments the input voltage $V_{IN}$ may be received from a suitable power supply, such as, in at least some modes of operation, a battery. In some embodiments, the voltage $V_{COMP}$ supplied to the analogue computation unit 210 may be a supply voltage for the analogue computation unit 210, i.e. to power various components of the analogue computation unit 210. In some embodiments the voltage $V_{COMP}$ supplied to the analogue computation unit 210 may be a reference voltage, for instance defining the voltage level corresponding to a certain value, e.g. a zero value level or midpoint voltage for bipolar processing. In some embodiments the voltage regulator 220 may output more than one voltage to the analogue computing unit 210, e.g. a supply and/or one or more reference voltages, although only one voltage is shown in FIG. 2 for clarity. In any case, as described above, in some embodiments, analogue signals generated as part of the computing performed by the analogue computation unit 210 may depend, at least partly, on the level of the voltage $V_{COMP}$ which is supplied to the analogue computation unit 210.

As will be understood by one skilled in the art, DC-DC converters, such as charge pumps or buck converters or the like, typically operate to cyclically regulate their output voltage. For instance, during operation, a charge pump may cycle through a sequence of different phases. During one or more of these phases a voltage at an output terminal of the charge pump (i.e. an output voltage of the charge pump such as $V_{COMP}$) may be maintained solely by a reservoir capacitor of the charge pump which was charged in a previous phase. During such a phase, any load current drawn by the load of the charge pump will deplete the charge of the reservoir capacitor and cause the relevant output voltage to droop. During another one or more of these phases a voltage developed within the charge pump may be applied to the output terminal, which recharges the reservoir capacitor. This cyclic regulation action results in a voltage ripple at the output. As will be explained in more detail below, such voltage ripple may be undesirable for analogue computing, and in particular any transients that may occur as a result of the change of phases of the voltage regulator.

Figure 3A:
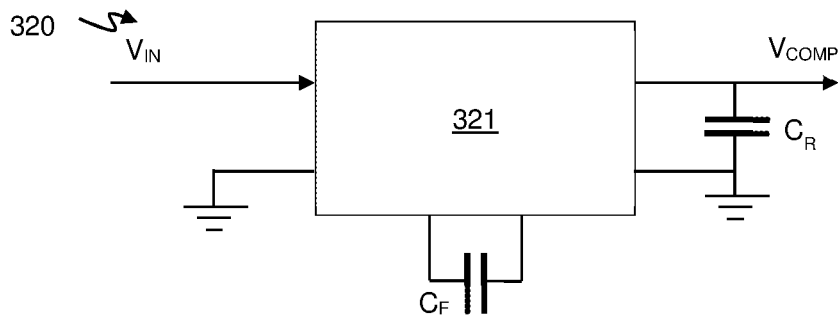
FIGS. 3a, 3b and 3c illustrate an example two-phase charge pump and method of operation.
Figure 3B:
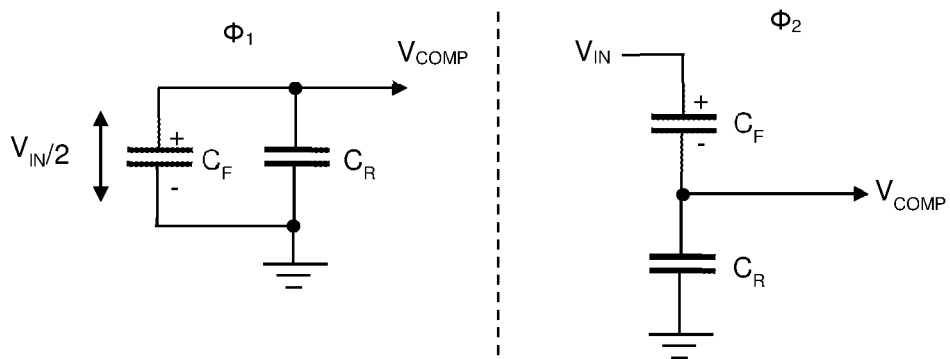
Figure 3C:
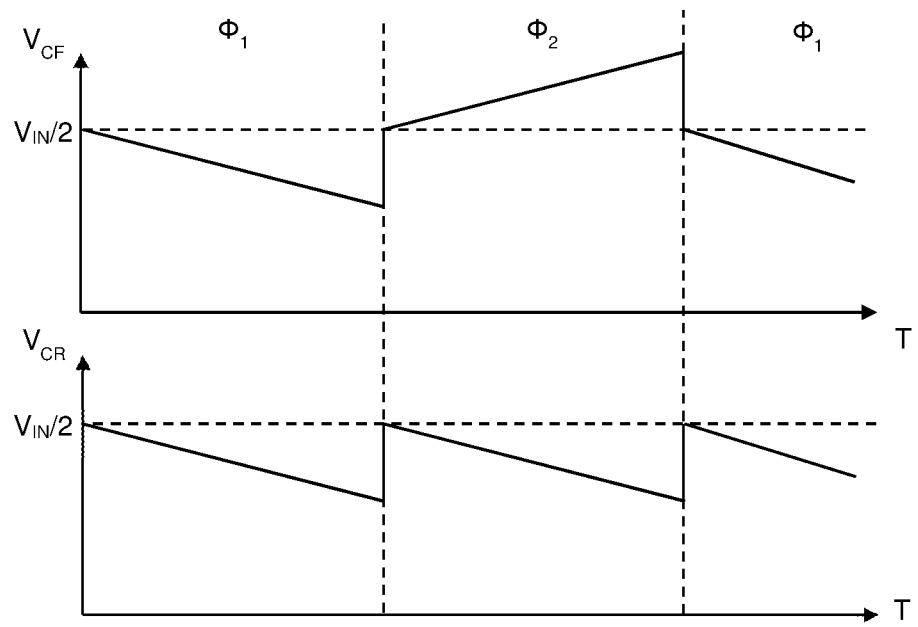

To illustrate this principle, FIGS. 3a, 3b and 3c illustrate, in simplistic form, an example operation of a simple two-phase charge pump 320, and how a voltage ripple may be generated by the operation of the charge pump 320. Referring to FIG. 3a the example two-phase charge pump 320 comprises an input to receive an input supply voltage $V_{IN}$ and an output to provide an output voltage, e.g. the voltage $V_{COMP}$. To maintain the voltage $V_{COMP}$ at the output, a reservoir capacitor is connected between the output of the charge pump and ground. Charge pump 320 further comprises flying capacitor $C_F$ and switching matrix 321. Switching matrix 321 is configured to connect flying capacitor $C_F$ with the reservoir capacitor $C_R$ in a first configuration in a first phase $\phi_1$ and a second configuration in a second phase $\phi_2$.

Referring to FIG. 3b, in the first phase $\phi_1$ the switching matrix 321 is configured such that the flying capacitor $C_F$ is connected in parallel with the reservoir capacitor $C_R$ and disconnected from the input voltage. This results in both capacitors equalising to the same voltage. In the second phase $\phi_2$, the switching matrix 321 is configured such that flying capacitor $C_F$ is connected in series with the reservoir capacitor $C_R$ between the input node of charge pump 320 and ground. In this configuration, the input voltage $V_{IN}$ is divided between the flying capacitor $C_F$ and reservoir capacitor $C_R$. By repeated operation in these states the reservoir capacitor is repeatedly charged to a voltage equal to $V_{IN}/2$, which thus provides the output voltage $V_{COMP}$.

FIG. 3c illustrates a timing diagram showing the variations in the voltages $V_{CF}$ and $V_{CR}$ of the flying capacitor $C_F$ and reservoir capacitor $C_R$ during operation of the charge pump 320 during the first and second phases $\phi_1$, $\phi_2$. At the start of the first phase $\phi_1$, the flying capacitor $C_F$ and reservoir capacitor $C_R$ are connected in parallel and thus equalise to the same voltage. Because of the previous instance of the second phase, the total voltage of the two capacitors is equal to the input voltage $V_{IN}$ and thus the capacitors each equalise to a voltage $V_{IN}/2$. However, as discussed above, due to a load current drawn by the load of the charge pump 320, the voltage on both flying capacitor $C_F$ and reservoir capacitor $C_R$ will exhibit droop over the duration of the phase, as both capacitors are connected to the output node of the charge pump 320.

At the end of the first phase $\phi_1$ the charge pump transitions to the second phase $\phi_2$, and the input voltage is divided across the two capacitors. As both the flying capacitor $C_F$ and the reservoir capacitor $C_R$ will droop by the same amount over the course of the first phase, the transition to the second phase will result in a near step change in the voltage across both flying capacitor $C_F$ and reservoir capacitor $C_R$ to $V_{IN}/2$. Once again, due to the load current drawn by the load of the charge pump 320, the voltage across the reservoir capacitor $C_R$ will droop over the course of the second phase. However, as the input voltage $V_{IN}$ is divided across the flying capacitor $C_F$ and reservoir capacitor $C_R$ in series, the voltage across the flying capacitor $C_F$ will ramp up at the same rate as the voltage droop on the reservoir capacitor $C_R$.

This variation in the voltages across flying capacitor $C_F$ and reservoir capacitor $C_R$ during the second phase, again results in a step-like change as the charge pump 320 transitions from the second phase $\phi_2$ to the first phase $\phi_1$ and the voltages on the two capacitors equalize to $V_{IN}/2$.

This variation in the voltages across the reservoir capacitor $C_R$ during the cyclic regulation of the phases of the charge pump 320 is thus seen as a voltage ripple in the output voltage $V_{COMP}$. In particular, the step-like changes that may be generated by the charge pump switching from one phase to the next can be seen as relatively significant disturbances in the output voltage $V_{COMP}$.

A DC-DC converter such as a buck converter also operates in a cyclic manner and can also introduce a voltage ripple into the output voltage of the buck converter. Typically a buck converter operates to cyclically cause the inductor current to ramp up in some states phases and to allow the inductor current to ramp down in other states phases.

Thus the output from a buck converter or the like also typically exhibits a voltage ripple, as switching between different phases can also introduce a disturbance into the output voltage.

Other operations of a DC-DC converter may additionally or alternatively cause a disturbance in the output voltage from the converter. For example, when a transistor switch changes state there may be a gate feedthrough voltage. Thus any transitions of switches that are connected or coupled to the output of the DC-DC converter could potentially result in some transients. These transient voltages due to switching would also occur at a phase transition of the DC-DC converter. Even if the switches connected to the output do not change state, parasitic capacitance may also be present in a DC-DC converter and coupling via the parasitic capacitance may occur on phase transitions.

In some instances, the supply voltage $V_{IN}$ provided to the DC-DC converter may include some relatively high frequency supply noise. For some DC-DC converters, in some phases of operation, the supply voltage may be coupled to the output of the DC-DC converter, i.e. a conductive path between the input and output via some components is established (such as in phase $\phi_2$ illustrated in FIG. 3b) and as such, the high frequency supply voltage noise mat couple to and cause a disturbance in the output voltage. Referring again to FIG. 2, if the voltage $V_{COMP}$ supplied to the analogue computing unit 210 by the voltage regulator 220 exhibits a disturbance, such as that introduced by any of the processes outlined above, this could potentially impact adversely on the processing performed by the analogue computing unit 210.

The analogue computing circuitry 200 illustrated in FIG. 2 thus further comprises a controller 230 which is configured to control operation of the voltage regulator 220. The controller 230 is further configured to control the analogue computation unit 210. The controller is configured to control operation of the voltage regulator 220 and/or operation of the analogue computation unit 210 such that the analogue computation unit processes data during a plurality of compute periods so that the compute periods avoid times at which the voltage regulator undergoes a phase transition which may be expected to result in a disturbance in the voltage $V_{COMP}$. As discussed above such a phase transition that may result in a disturbance in the voltage $V_{COMP}$ may, in particular, be one in which the output of voltage regulator 220 is connected in a different configuration that may result in a transient at the output, for instance due to some component being connected to the output during the phase transition. Based on the type of voltage regulator it may be possible to identify a predefined set of phase transitions, i.e. transition between defined phases in said sequence of phases such as transition from a first phase to a second phase etc., that may be likely to lead to a relatively significant disturbance on the voltage output. As such, the controller 230 operates the analogue computation unit 210 to avoid processing data during periods that include a phase transition from said predefined set where a disturbance is expected to result in voltage $V_{COMP}$, as a disturbance in the voltage $V_{COMP}$ may adversely impact the computation of analogue computation unit 210. The controller 230 may therefore be configured to control the timing of the compute periods with respect to the phases of operation of the voltage regulator, i.e. to control the times at which the compute periods begin and end and/or the times at which the voltage regulator may undergo a phase transitions, to avoid any phase transitions of the predefined set during a compute period. In some embodiments all of the phase transitions that occur as part of the sequence may be identified as part of the predefined set, but for voltage regulator only some phase transitions may be problematic and identified as part of the predefined set.

Referring to FIG. 2, the controller 230 may therefore be configured to supply a regulator control signal $EN_R$ to control operation of the voltage regulator unit 220, e.g. to enable regulation of $V_{COMP}$, and supply a compute control signal $EN_C$ to control operation of the analogue computation unit 210, e.g. to enable and disable data processing. In one embodiment, controller 230 may comprise a clocking unit 231. In some embodiments, the regulator control signal $EN_R$ and the compute control signal $EN_C$ may therefore each comprise a clock reference signal supplied by clocking unit 231.

Figure 4A:
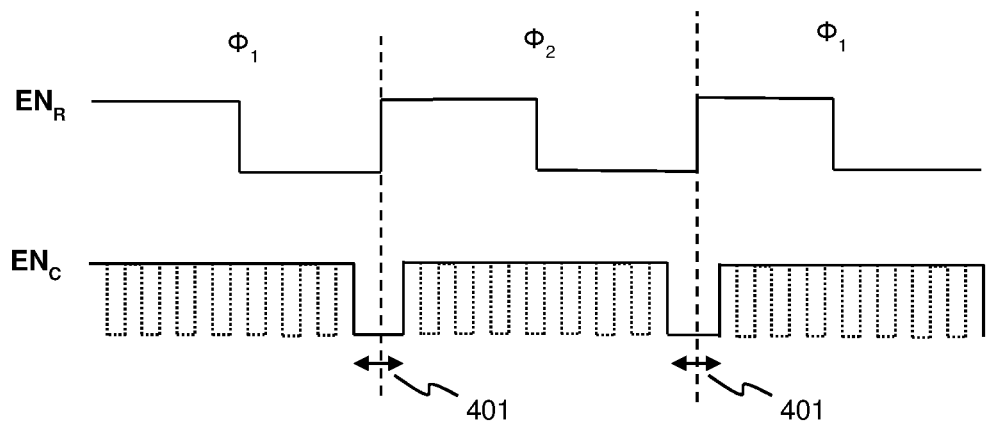
FIGS. 4a, 4b and 4c illustrate examples of timing diagrams for waveforms of computing circuitry according to embodiments.

FIG. 4a illustrates a timing diagram showing an example operation of the controller 230 for generating regulator control signal $EN_R$ and compute control signal $EN_C$. As illustrated, regulator control signal $EN_R$ may comprise a clock reference signal, which may be supplied from clocking unit 231, which cyclically controls regulation of the voltage $V_{COMP}$. In some embodiments regulator control signal $EN_R$ may instead be a non-clock signal which is used to gate clocks or clock-based signals within the regulator.

In the illustrated embodiment, the voltage regulator 220 may comprise a DC-DC converter, which may operate in two-phases of operation. For example, the voltage regulator 220 may operate in a similar way to the charge pump 320 discussed in relation to FIGS. 3a-c. It will be understood however that this is just one simple example for the purposes of explanation, and other DC-DC converters could be used, such as charge pumps that operate with more than two different phases and/or which generate different ratios of output voltage to the input voltage. As discussed above a disturbance in the voltage $V_{COMP}$ may, for at least some voltage regulators, be likely to occur at every phase transition of the voltage regulator 220, i.e. every phase transition of the sequence may form part of the predefined set of potentially problematic phase transitions. The controller 230 may therefore control analogue computation unit 210 to avoid processing data during every phase transition of voltage regulator 220, i.e. to time the compute periods to avoid every phase transition.

Referring to FIG. 4a, the controller may supply a regulator control signal $EN_R$ as a clock signal for controlling transition between the different regulator phases. In the example of FIG. 4a, the voltage regulator is configured to transition from the first phase $\phi_1$ to the second phase $\phi_2$, or vice versa, at a rising edge of the regulator control signal $EN_R$. The duration of the regulator phases is thus controlled by the cycle period of the regulator control signal $EN_R$. The controller 230 may supply the compute control signal $EN_C$ to analogue computation unit 210 to enable the analogue computation unit 210 to process data during the period of each regulator phase. However, to avoid any possible disturbance on $V_{COMP}$ due to the phase transitions of voltage regulator 220, the controller 230 controls the compute control signal $EN_C$ to effectively disable computation during the phase transitions of voltage regulator 220. This operation of compute control signal $EN_C$ suspends the analogue computation unit 210 from processing data during a period 401 including the phase transition, in other words the compute period occurs within the duration of a single phase. Thus any disturbance occurring on voltage $V_{COMP}$ as a result of the phase transition does not interact with the processing of data by the analogue computation unit 210. As, in this example, the controller 230 generates the regulator control signal $EN_R$ as a clock signal for controlling the timing of the phase transitions of the voltage regulator, the controller can readily determine when the phase transitions will occur and thus can control the compute control signal $EN_C$ accordingly. For example the controller could generate or receive a suitable clock signal and apply a small delay. The delayed version could be output as the regulator control signal $EN_R$ and the undelayed version used as a look-ahead for controlling the compute control signal $EN_C$.

It will be understood that during the compute period within a given phase of the voltage regulator during which computing is enabled, the voltage $V_{COMP}$ from the voltage regulator may vary and in particular, in at least some phases, may exhibit some droop as described above. However the voltage change due to such droop may be relatively slow and continuous and thus may be less problematic for the analogue computing unit. Additionally and alternatively in some embodiments some compensation may be applied for this relatively slow droop as will be described in more detail later.

In some embodiments the compute control signal $EN_C$ may be a two level signal, where one signal level enables computation and the other signal level suspends or disables computation, as illustrated by the solid line in the example of FIG. 4a where the signal goes high to start a compute period and enable computing and goes low to end the compute period and disable computing. Alternatively the compute control signal $EN_C$ may itself comprise a clock signal for controlling operation of the analogue computation unit 210. For instance the analogue computation unit 210 may process data in a computing cycle defined by a clock signal, e.g. by the rising edge of a clock signal. The processing period may have a shorter duration than the period of a phase of the voltage regulator so that one or more processing periods may be completed within a single phase of the voltage regulator. In this case, as illustrated by the dotted waveform in FIG. 4a, the compute control signal $EN_C$ could be a clock signal which is supplied to enable one or more processing cycles in a compute period during each phase of the voltage regulator, but which is suspended during the period 401 including a phase transition so as to avoid any computing being performed at the point of the phase transition of the voltage regulator 220.

In the example of FIG. 4a, the compute control signal $EN_C$ is controlled so as to disable or suspend computing for each phase transition of the voltage regulator, which thus mitigates the risk of any transients resulting from a phase transition affecting the computing. In some instance however the voltage regulator 220 may be a DC-DC converter for which at least one of the phase transitions of the voltage regulator 220 may not be expected to cause any significant disturbance in the voltage $V_{COMP}$ output from the regulator 220. In other words at least one phase transition in the sequence of phases may not form part of the predefined set of potentially problematic phase transitions. In which case the controller may be configured so as to allow computing to continue during such a phase transition, such as illustrated in FIG. 4b.

Figure 4B:
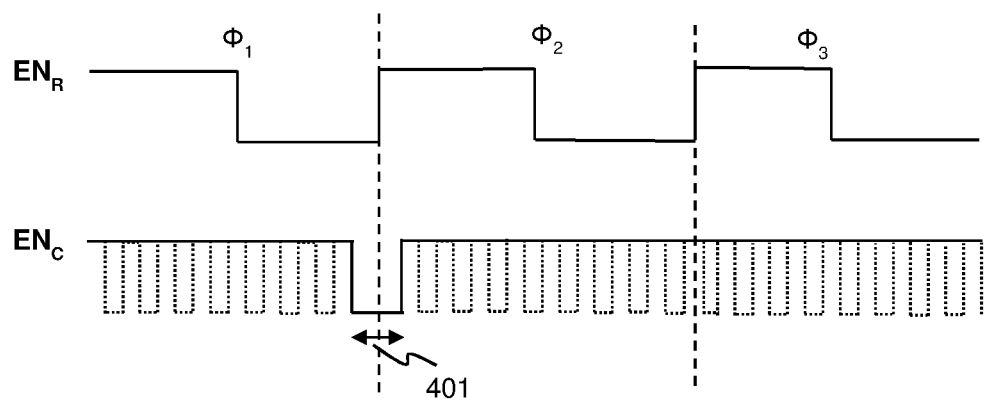

FIG. 4b thus illustrates a timing diagram showing another example operation of the controller 230 for generating regulator control signal $EN_R$ and compute control signal $EN_C$. The controller 230 may again generate regulator control signal $EN_R$ and compute control signal $EN_C$ as described in a similar way to that described with reference to FIG. 4a. However, in the illustrated embodiment of FIG. 4b, the voltage regulator 220 is configured to transition through three phases $\phi_1$, $\phi_2$, $\phi_3$.

The phase transition from the first phase $\phi_1$ to the second phase $\phi_2$, may be one which is expected to cause a disturbance in the voltage $V_{COMP}$, and thus forms part of the predefined set of phase transitions to be avoided for computing. For example, for a charge pump the transition from the first phase $\phi_1$ to the second phase $\phi_2$, may result in a different capacitance being connected to the output which could result in a step change in voltage of the output, and/or a switch transition of a switch connected to the output and hence the possibility of a gate voltage feedthrough transient. As such, the controller 230 may therefore control compute control signal $EN_C$ so that the compute period avoids this phase transition, i.e. to disable or suspend the analogue computing unit 210 from processing data during a period 401 including this phase transition. However, during the phase transition from the second phase $\phi_2$ to third phase $\phi_3$, the voltage $V_{COMP}$ may be not expected to experience any significant disturbance and such a phase transition may thus not form part of the predefined set of phase transitions to be avoided. For example in the transition from the second to the third phase it may be the case that there is no change in the configuration of components connected to the output. For instance, in the second phase the relevant output of the charge pump may be disconnected from most of the rest of the charge pump, with the voltage at the output being maintained by the reservoir capacitor. In the third phase, whilst another part of the charge pump may be reconfigured, there may be no change in configuration of the output, i.e. the components and conductive paths connected to the output may not change, in which case it may be that no significant disturbance at the output is likely. In some instances the output configuration could change from the second to the third phase, but only by the disconnection of some component, e.g. a flying capacitor, in a way that may not result in any significant disturbance. The controller 230 may therefore control the compute control signal $EN_C$ during this transition to allow the analogue computing unit 210 to continue to process data and the compute period thus includes this phase transition. As a disturbance is not expected to occur during the transition from the second phase $\phi_2$ to third phase $\phi_3$, there may be low risk of any adverse effects on data processing resulting from the voltage $V_{COMP}$ being supplied to the analogue computation unit 210 during this transition.

In the examples illustrated in FIGS. 4a and 4b, the compute control signal $EN_C$ is controlled to allow computing during at least part of each phase of the voltage regulator, with computing being suspended for at least some phase transitions. In some implementations however it may be advantageous to suspend computation for the whole of some of the regulator phases, in other words it may be desirable for there to be no compute periods when the voltage regulator is in at least one predefined phase of the sequence of phases. For example, in some embodiments, the supply voltage input to voltage regulator 220 may comprise relatively high frequency noise. In any phase where the input is coupled via a conductive path to the output of the regulator 220, the high frequency supply noise may result in corresponding noise in the voltage $V_{COMP}$. To mitigate against the presence of such noise adversely affecting the computation, the controller 230 may control the analogue computation unit 210 to suspend processing data during a period in which the voltage regulator 220 is operating in a phase where the input of the regulator 220 is coupled to the output of the regulator 220, as illustrated in FIG. 4c.

Figure 4C:
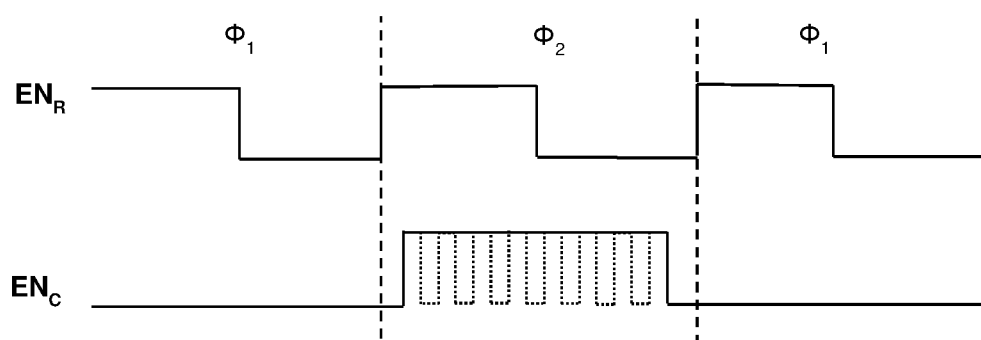

FIG. 4c illustrates a timing diagram showing another example operation of the controller 230 for generating regulator control signal $EN_R$ and compute control signal $EN_C$. The controller 230 may again generate regulator control signal $EN_R$ and compute control signal $EN_C$ in a similar way to that described with reference to FIG. 4a.

In this example the voltage regulator 220 may comprise two phases of operation. In the first phase $\phi_1$, the input of the voltage regulator may be connected to the output of the voltage regulator 220, typically via one or more components depending on the type of voltage regulator. As noted above the supply voltage provided to the voltage regulator 220 may comprise a noise component, which may manifest itself in the voltage $V_{COMP}$ during the first phase $\phi_1$. As such, the controller 230 may configure compute control signal $EN_C$ to suspend processing data, so that there is no compute period, during the entirety of the first phase. This operation may ensure that the disturbance on the voltage $V_{COMP}$ does not cause any adverse effects in the processing of data during the first phase $\phi_1$.

In the second phase $\phi_2$, the regulator 220 may be configured such that the input of the regulator 220 is not coupled to the output of the regulator 220. Therefore, during the second phase $\phi_2$ the noise component of the supply voltage input to the regulator 220 may not cause any disturbance of the voltage $V_{COMP}$. The analogue computation unit 210 may thus be able to process data without the voltage $V_{COMP}$ causing any adverse effects on data processing. The controller 230 may therefore control the compute control signal $EN_C$ to enable the analogue computation unit 210 to process data during the second phase $\phi_2$. The compute control signal $EN_C$ may however only enable computation a short time after the transition to the second phase so as to avoid any transients that may occur with the transition between phases.

In the examples discussed above the regulation control signal $EN_R$ comprises a clock signal for controlling the timing of the phases of the voltage regulator and the controller 230 controls the compute control signal $EN_C$ with respect to this timing signal so as to enable and disable computing within periods defined by this clock signal for the voltage regulator. In other words the timing of the compute periods of data processing is controlled to fit within periods defined by the phases of the voltage regulator. Such operation may be appropriate if the computing performed by the analogue computing unit 210 operates in processing cycles of a known duration and computing may be suspended at any point. In some implementations however the time taken to complete a particular processing operation may be variable and/or it may be undesirable to suspend computing at certain points. In such a case the controller 230 may be operable to adjust the timing of the phase transitions of the voltage regulator to avoid unwanted phase transitions whilst computing is being performed.

Referring again to FIG. 2, in some embodiments the computation unit 210 may thus be configured to supply a computation status $S_{COMP}$ to controller 230. Status $S_{COMP}$ may comprise a signal indicative of whether or not the analogue computing unit is processing data and/or has completed a set of operations and computing may be suspended. In some embodiments, controller 230 may be configured to control operation of voltage regulator 220 based on the status $S_{COMP}$ of analogue computation unit 210.

In some embodiments, controller 230 may suspend the voltage regulator 220 from undergoing a phase transition when the status $S_{COMP}$ of the analogue computation unit 210 indicates that the analogue computation unit 210 is processing data and computing should not be suspended, so as to avoid a possible disturbance in the voltage $V_{COMP}$. In some embodiments, the controller 230 may therefore control the voltage regulator 220 to delay the phase transition until the status indicates that analogue computation unit has finished processing data or completed a processing operation and computing may be suspended.

Figure 5:
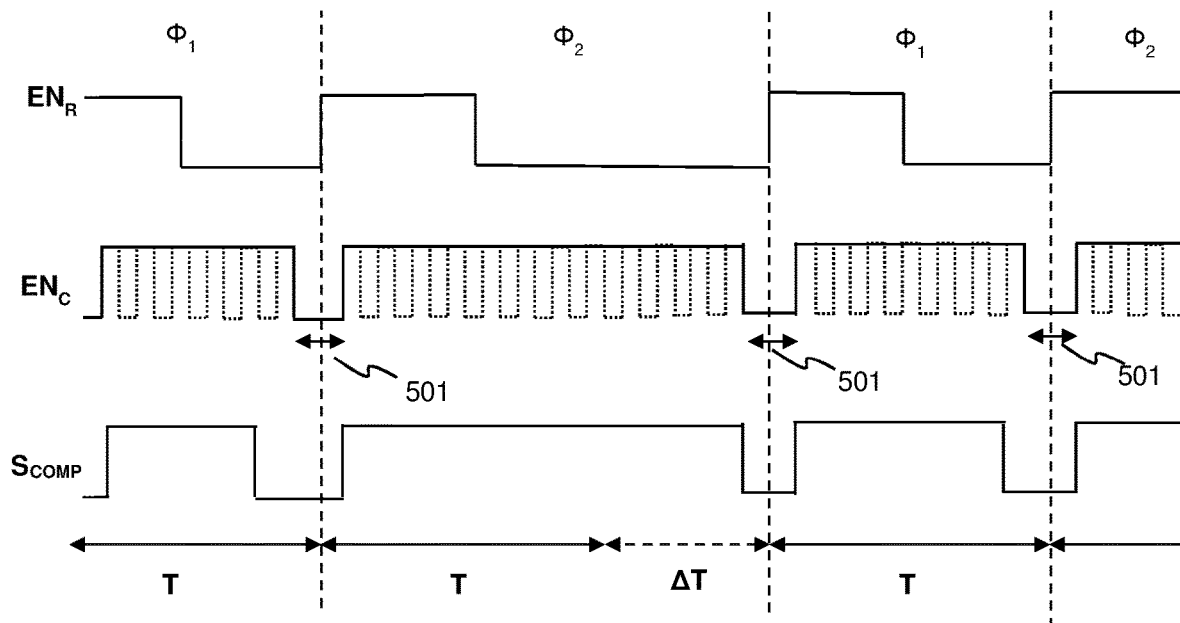
FIG. 5 illustrates another example of a timing diagram for waveforms of computing circuitry according to embodiments.

FIG. 5 illustrates a timing diagram showing an example operation of the controller 230 for generating regulator control signal $EN_R$ and compute control signal $EN_C$ where the controller 230 may delay a phase transition of the voltage regulator. The controller 230 may generate regulator control signal $EN_R$ and compute control signal $EN_C$ in a similar way as described with reference to FIG. 4a.

In this example voltage regulator 220 is operable in two phases, first phase $\phi_1$ and second phase $\phi_2$. In the illustrated example the controller 230 may control the compute control signal $EN_C$ so as to disable computing during each phase transition of voltage regulator 220, in a similar way as described with reference to FIG. 4a. Controller 230 may further be configured to operate voltage regulator 220 such that, nominally, the voltage regulator 220 is operated in first phase $\phi_1$ and second phase $\phi_2$ for an equal duration of time T.

In this example however the controller 230 is further configured to control operation of voltage regulator 220 based on the status $S_{COMP}$ of analogue computation unit 210. Referring to FIG. 5, in this example the voltage regulator is initially operating in the first phase. After transitioning to this phase, the compute control signal enables computing and starts a compute period. The analogue computing unit thus starts computing and generates the computing status signal to indicate computing is occurring. In this example the necessary compute operations are completed within this phase duration T, thus the computing status signal $S_{COMP}$ changes state to indicate computing can be suspended. The computing control signal $EN_C$ thus suspends computing before the end of the phase period so as to suspend computing during a period 501 comprising a phase transition. In the next phase, in this example the second phase, the compute control signal $EN_C$ re-enables computing and the analogue computing unit 210 starts computing. In this example however the analogue computing unit 210 is still processing an operation or series of operations at the end of the normal phase duration T. In this case the computing status signal $S_{COMP}$ indicates that computing should not be suspended and thus the phase transition is delayed to avoid any transient. When the computing status signal signals that the operation is complete, the compute control signal indicates any further computing should be suspended and the regulator control signal is then controlled to allow the phase transition. The phase transition is thus delayed by an amount T. In some embodiments the phase transition may occur as soon as possible after computing has finished, but in some embodiments the phase transition may occur at the next relevant clock edge of a clock signal used for the regulator control signal.

During the period in which a phase transition is delayed the voltage regulator may persist in its current phase, as illustrated in the FIG. 5. However in some embodiments, the controller 230 may control the voltage regulator 220 to transition the voltage regulator to a holding phase, for instance which may correspond to phase in which a reservoir capacitor of the voltage regulator 220 is disconnected from the other components of the voltage regulator 220, such that, voltage $V_{COMP}$ is provided solely from the reservoir capacitor. Whilst transitioning from the present operating phase of the voltage regulator to the holding phase may involve a phase transition, such a phase transition, where components are only disconnected from the output, may be one which is unlikely to generate any disturbance on the output. In some embodiments, one of the normal phases of operation of the regulator 220 may be suitable as such a holding phase, and thus the controller may transition to such a phase, possibly out of sequence when the status signal $S_{COMP}$ indicates that the analogue computing unit 210 is processing data and a phase transition would normally occur.

The discussion above has focussed on the voltage regulator 220 undergoing a phase transition at a time determined by a clock signal (unless the transition is possibly delayed to allow a computing operation to complete, but even then, as mentioned, the phase transition may occur at the next relevant clock edge). In some DC-DC converters, such as some charge pumps for example, each phase transition may normally be triggered by a clock signal and thus the phase transitions would be synchronised to the clock signal. In the examples discussed above the regulator control signal may provide the clock signal for controlling the phase transitions, however in some embodiments the voltage regulator may comprise its own clock generator and the regulator control signal $EN_R$ could be a signal that either enables the voltage regulator to undergo phase transitions or which suspends the voltage regulator from undergoing phase transitions. In which case, the controller 230 may need to receive an indication of when the voltage regulator will normally undergo a phase transition so that it can enable or disable computing at an appropriate time.

Also, some voltage regulators 220 may comprise a DC-DC converter wherein at least some phase transitions are not synchronised to a clock signal. For example, a buck converter switches between a first charging phase, in which an inductor node is coupled to the input voltage, and a second discharging phase, in which the inductor node is coupled to a reference voltage such as ground. In some buck converters one of the phase transitions may be determined by a clock signal, but the other phase transition may be based on the comparison of a monitored voltage or current to a threshold and the duty cycle of the converter phases may vary in use to maintain the desired output voltage. For such converters the times at which the voltage regulator 220 undergoes at least some phase transitions may not be predetermined and may not be synchronised to a control clock signal.

Referring again to FIG. 2, in some embodiments, controller 230 may thus be configured to receive a regulator status $S_R$ from regulator 220. The regulator status $S_R$ may be indicative of which phase the regulator is operating in and/or may further indicate that the regulator has undergone or would, in normal operation, be about to undergo, a phase transition. In embodiments where at least some of the phase transitions are all controlled by a clock signal which is not supplied by the controller 230, the controller could receive a version of the relevant clock signal. In some instances a delayed version of the clock may be used by the voltage regulator to control the phase transitions, with an undelayed version being supplied to the controller 230 to control the compute control signal in a similar manner as described above so as to provide advance warning of the phase transition to the controller 230 so it can suspend computing at an appropriate time.

In some embodiments, for phase transitions that are not synchronised to a clock signal, the regulator status $S_R$ may be indicative that the voltage regulator 220 achieving or approaching a condition to undergo a phase transition which is one of the predefined set expected to result in a disturbance in the voltage $V_{COMP}$. For example, as discussed above a buck converter may be operable in a first charging phase or a second discharging phase and at least one phase transition may be controlled by an internal control unit of the converter and not synchronised to a clock signal. For such a phase transition the regulator status $S_R$ may be output from the control unit. In some embodiments computing may be performed during just one of the phases, which may be the phase which may start at any time during the converter cycle period, but which ends at a time defined by a clock signal. For example in a peak-current mode buck converter the first charging phase may start at a time synchronised to a clock signal and end at a variable time determined by the control unit. The second discharging phase may thus start at the variable time and finish at a time determined by the clock signal. The controller 230 may be configured to enable computing just during the second discharging phase so as to avoid the possibility of any supply noise adversely affecting the computing and/or so that the discharging phase can be extended if required to complete a computing operation without any risk of overcharging any voltage components (which could be risk with extending the charging phase). In which case the regulator status signal may be an indication that the voltage regulator has transitioned from the first charging phase to the second charging phase and thus computing can be enabled. Computing can then be suspended at a time based on the clock signal to suspend computing prior to the transition from the second phase to the first phase.

In some embodiments however it may be desirable to perform computing during a phase in which the end of the phase is not synchronised to a clock signal but the relevant phase transition would be likely to lead to an unwanted disturbance on the voltage $V_{COMP}$. In which case the regulator status signal $S_R$ may indicate that the voltage regulator is undergoing or is likely to about to undergo a phase transition such that the controller can suspend computing before any disturbance on the voltage $V_{COMP}$ as a result of the phase transition.

As noted above for some DC-DC converters, the phase transition may be triggered by a monitored signal reaching a first threshold. In some embodiments the regulator status could comprise an indication that the first threshold has been reached and that the voltage regulator is undergoing a phase transition. The controller 230 may receive this signal and suspend computing before the phase transition results in any disturbance to the voltage $V_{COMP}$. In some embodiments however there may be some latency associated with the time required to generate the signal to suspend computing and for any computing cycle to complete, in which case advance warning of the transition would be beneficial. In such a case the voltage regulator control unit may also compare the monitored signal to a second threshold, which will be reached before the first threshold, and which is set at a level to give sufficient time, based on the expected worst case or monitored operating conditions, for the controller 230 to suspend computing.

If the regulator status $S_R$ indicates that the regulator 220 is about to undergo a phase transition and, at the same time, a compute status signal $S_{COMP}$ indicates that the analogue computation unit 210 is processing data, the controller 230 may control voltage regulator 220 to delay a phase transition, and thus maintain the current phase, via the regulator enable signal $EN_R$, to prevent the phase transition from introducing a disturbance in voltage $V_{COMP}$ whilst analogue computation unit 210 is processing data. Once the compute status signal $S_{COMP}$ indicates that the analogue computation unit 210 has completed the processing operation, the controller 230 may then enable the voltage regulator 220 to undergo the phase transition to the next phase.

It will also be appreciated that maintaining the voltage regulator 220 in a given phase for an increased duration of time, may also cause an increased variation, e.g. droop, of the voltage $V_{COMP}$. The voltage $V_{COMP}$ may therefore droop to a lower magnitude the longer the voltage regulator is maintained in a given phase. However, as the droop may be a relatively predictable phenomenon and may occur with a relatively slow and constant rate, this may be within the accuracy tolerance of the analogue computing unit 210 and/or may be mitigated for in the design of analogue computation unit 210, as will be described in more detail below.

The examples discussed above thus enable computing in computing periods during at least some phases of operation of the voltage regulator and suspends computing during a period that includes a transition between phase that would likely lead to an unwanted disturbance on the voltage(s) $V_{COMP}$ supplied from the voltage regulator to the analogue computing unit. In some instances there controller may be configured so as to suspend computing during any phase transition. In some embodiments the circuitry may also be configured to control the computing that is performed during the different phases of voltage regulator operation.

For example, the rate of voltage droop may be different in different regulator phases and the analogue computation unit 210 and voltage regulator 220 may be configured such that processing operations that may require the longest amount of time to complete by analogue computation unit 210 are performed during such regulator phases with the lowest rate of droop. This may mitigate any effect over the whole computing period, and such regulator phases may be extended if required for the longest period with the voltage $V_{COMP}$ dropping below some minimum threshold for satisfactory operation.

Equally some phases of regulator operation may exhibit faster rates of droop, or a greater likelihood of noise in the voltage $V_{COMP}$. Some processing operations may be more robust to minor disturbances or noise on the voltage $V_{COMP}$ than others. The analogue computation unit may therefore be configured to carry out more highly sensitive processing operations or operations that require the highest degree of accuracy during regulator phases with the least voltage droop or lowest noise.

In some embodiments however it may not be desirable or practical to start and stop the computing processes within the periods of the regulator phases. Therefore, in some embodiments, controller 230 may be configured to operate the voltage regulator 220 in a first mode, with active regulation of the voltage $V_{COMP}$, and in a second mode to suspend regulation of the voltage $V_{COMP}$. In the first mode the voltage regulator 220 thus performs cyclic regulation of the voltage $V_{COMP}$, but in the second mode the cyclic regulation is suspended. The controller 230 may be further configured to control the analogue computation unit 210 to process data during a compute period in which the voltage regulator 220 is operating in the second mode. The controller may thus control the analogue computation unit 210 so as to not process data during a period in which the voltage regulator 220 is operating in the first mode. The controller 230 may thus be configured to supply the regulator control signal $EN_R$ to control operation of the voltage regulator 220, e.g. to enable and disable cyclic regulation, and supply a compute control signal $EN_C$ to control operation of the analogue computation unit 210, e.g. to disable and enable data processing. In this way, any disturbance that may be present in the voltage $V_{COMP}$ during regulation may not interact with the processing of analogue computation unit 210.

Figure 6A:
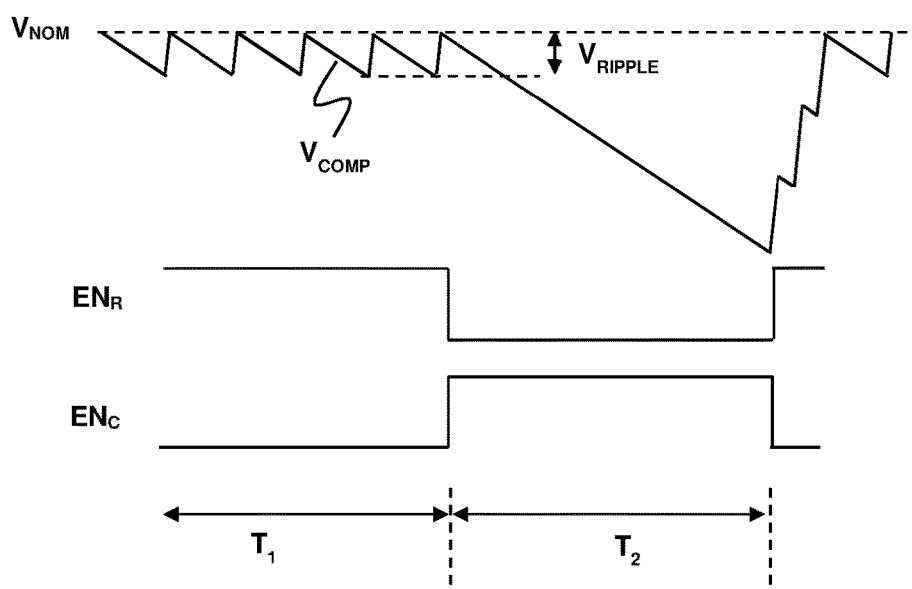
FIGS. 6a, 6b and 6c illustrate more examples of timing diagrams for waveforms of computing circuitry according to embodiments.

FIG. 6a illustrates another example timing diagram of the waveforms for the voltage $V_{COMP}$, the regulator control signal $EN_R$ and the compute control signal $EN_C$. During a first time period $T_1$, controller 230 operates the voltage regulator 220 in the first mode so as to regulate the voltage $V_{COMP}$ by cyclically sequencing the voltage regulator through a plurality of phases. In this example the controller 230 outputs regulator control signal $EN_R$ in a high state to enable operation of the voltage regulator 220 in the first mode. In this example the regulator control signal $EN_R$ thus enables or disables operation of the voltage regulator, where the timing of at least some of the phase transitions may be determined by a separate clock signal. However it equally would be possible, as described in more detail later, for the regulator control signal $EN_R$ to be a varying clock signal from clocking unit 231 during the first mode to control sequencing of the voltage regulator 220 through the plurality of phases to regulate voltage $V_{COMP}$, and then to be held at a constant level, with no relevant clock edges, during the second mode.

During the first time period $T_1$ the voltage $V_{COMP}$ is therefore actively regulated to a nominal voltage level $V_{NOM}$ by the voltage regulator 220. In relatively steady state operation, as illustrated in FIG. 6a, the voltage $V_{COMP}$ output from the voltage regulator will thus be maintained at, or about, the nominal voltage level $V_{NOM}$ but will exhibit a certain voltage ripple $V_{RIPPLE}$ depending on the load current drawn and the switching frequency of the voltage regulator 220. Note the nominal voltage $V_{NOM}$ is illustrated as a maximum voltage for simplicity in FIG. 6a but equally this could be some other level, such as an average voltage level, depending on the type of voltage regulator.

As noted above, the voltage ripple $V_{RIPPLE}$ exhibited by the voltage $V_{COMP}$ may introduce a disturbance in the analogue computing circuitry 200, which may cause artefacts or errors in the processing of analogue computation unit 210. As such, the controller 230 is therefore configured to control the analogue computation unit 210 to process data during a compute period in which the voltage regulator 220 is operating in the second mode i.e. when the voltage regulator 220 suspends cyclic regulation of the voltage $V_{COMP}$.

As illustrated in FIG. 6a, in the second time period $T_2$, the controller 230 switches operation of the voltage regulator 220 to the second mode to disable or suspend regulation of the voltage $V_{COMP}$. In this example the regulator control signal $EN_R$ goes low and is held at a constant level. This suspends regulation of voltage $V_{COMP}$ and as illustrated in FIG. 6a, the voltage $V_{COMP}$ will droop, based on the loading on the voltage regulator.

In this suspended regulation mode of operation, the voltage ripple $V_{RIPPLE}$ is no longer present in the voltage $V_{COMP}$ supplied to the analogue computation unit 210. The controller 230 operates analogue computation unit 210 to process data during the second time period $T_2$, whilst regulation of the voltage $V_{COMP}$ has been suspended and the voltage ripple $V_{RIPPLE}$ is not present. In this example the compute control signal $EN_C$ goes from low to high to enable processing. The analogue computation unit 210 thus receives and processes data and provides the output signal $OUT_{UN}$ during the second time period $T_2$.

The analogue computation unit 210 thus operates to process data during a compute period in which the voltage $V_{COMP}$ supplied to the analogue computation unit 210 is free from any voltage ripple, and in particular from any transients arising from the phase transitions. Whilst the voltage $V_{COMP}$ supplied to the analogue computation unit 210 may decrease, i.e. droop, over the second time period, the relatively slow and continuous voltage droop may be less problematic than the cyclic voltage ripple, that may comprise a rapid voltage change during a phase transition.

At the end of the second time period 12, the compute control signal $EN_C$ may, in this example, go low, to stop further data processing and the regulator control signal $EN_R$ may re-enable cyclic regulation by the voltage regulator 220, i.e. control the voltage regulator 220 to operate in the first mode. The voltage $V_{COMP}$ will thus again be actively regulated to the nominal voltage $V_{NOM}$, although depending on the duration of the second time period 12 and the amount of droop, it may take a few regulator cycles for the voltage $V_{COMP}$ to reach the nominal voltage level.

The first and second time periods $T_1$ and $T_2$ of operation of the voltage regulator 220 in the first and second modes are defined, in this example, by the regulator control signal $EN_R$, which in this example goes high to enable active regulation and goes low to suspend regulation (although it will be appreciated the opposite operation could be implemented). In the example of FIG. 6a, the compute control signal $EN_C$ enables data processing for the entirety of the second time period $T_2$. In this example the compute control signal $EN_C$ enables data processing when in the high state, and thus the compute control signal $EN_C$ can be seen as being the inverse of, or in antiphase with, the regulator control signal $EN_R$. It will be appreciated that the regulator control signal $EN_R$ could also be used as the compute control signal $EN_C$ with one state of the regulator control signal $EN_R$ enabling active voltage regulation and suspending computation, and the other state suspending voltage regulation and enabling computation. In some implementations however the period in which the compute control signal $EN_C$ enables data processing by the analogue compute unit 210 may start and/or end at a different time to the second time period 12. For instance there may be short delay between a change of state of the regulator control signal $EN_R$ to signal the beginning of the period 12 and a corresponding change of state of the compute control signal $EN_C$. Such delay may, for example, allow time for active regulation to cease and/or dissipation of any transients associated with suspending regulation. Additionally or alternatively, a change of state of the compute control signal $EN_C$ to end the period of data processing may occur a short time before a corresponding change of state of the regulator control signal $EN_R$ to re-enable active regulation, e.g. to allow time for a current processing cycle to complete.

In any case the analogue computing circuitry 200 may therefore be seen as being operable in two modes, a first mode where the voltage regulator 220 is actively regulating the voltage $V_{COMP}$ and computing is suspended, and a second mode in the cyclic regulation by the voltage regulator 220 is suspended and data processing is performed, possibly with a transition between the states where both voltage regulation and data processing is suspended.

It should be noted that whilst data processing by the analogue computing unit 210 may advantageously be suspended during a period in which the voltage regulator 220 is actively regulating the voltage $V_{COMP}$ it may, in some implementations, be advantageous to perform some operation of the analogue computing unit 210 during such period, e.g. to perform some preparatory steps prior to a calculation or to maintain a relatively constant operation. In such a case however the data of interest may only be processed during a period in which active voltage regulation is suspended and/or only the results of processing during a period in which active voltage regulation is suspended may be considered valid.

As noted above, in some embodiments, the controller 230 may selectively supply the clock signal from the clocking unit 231 so as to enable operation in the first mode, but suspend supply of the clock signal so as to suspend cyclic regulation and thus control operation in the second mode, as illustrated in FIG. 3b. During the first time period $T_1$ the regulator control signal $EN_R$ may thus be derived from the clock signal from the clocking unit 231 and thus will cycle between different signal levels at the clocking frequency. The voltage regulator 220 responds to the rising or falling edges of the regulator control signal $EN_R$ as an input clock signal and cycles through a sequence of states to cyclically regulate the voltage $V_{COMP}$. To operate the voltage regulator 220 in the second mode, the regulator control signal $EN_R$ may be held at a constant signal level and thus the lack of any rising or falling edges means that the voltage regulator does not cycle through any states, which suspends regulation of the voltage $V_{COMP}$.

In some embodiments the controller 230 may be configured to operate the analogue computing circuitry 200 such that there are a plurality of compute periods during which active voltage regulation is suspended and during which data processing is performed, interspersed with periods in which data processing is suspended and voltage regulation is enabled. The controller 230 may therefore operate to repeatedly sequence between periods of voltage regulation by voltage regulator unit 220 and periods of computation by analogue computation unit 210. In some embodiments, the controller 230 may be configured to repeatedly control operation in the first mode during a plurality of first time periods $T_1$ interspersed with operation in the second mode during a plurality of second time periods $T_2$. In the example of FIG. 6a, the controller may be configured to alternate between instances of the first time period $T_1$ and the second time period $T_2$ in a repeating alternating sequence.

In some embodiments the durations of first time period $T_1$ and second time period $T_2$ may be predetermined, i.e. in some embodiments the controller 230 may be configured to operate the voltage regulator unit 220 in the first mode, with data processing by the analogue computing unit 210 suspended, for a predetermined first duration of time and operate the voltage regulator unit 220 in the second mode, with voltage regulation enabled, for a predetermined second duration of time. In some instances, the first time period $T_1$ and the second time period $T_2$ may be equal in duration. In some instances the first time period $T_1$ and the second time period $T_2$ may be unequal in duration.

As noted above, during the second time period, where voltage regulation is suspended, but during which the analogue computing unit 210 may be processing data, the analogue computing unit 210 may draw current from a suitable reservoir of the voltage regulator, e.g. a reservoir capacitor, and the voltage $V_{COMP}$ may droop. It may be desirable to limit the amount of droop during the second time period and thus the duration of the second time period may be determined so as to ensure the voltage droop during the second time period remains within acceptable limits, even in the worst case expected operating conditions. The duration of the second time period may also be determined with regard to the operation of the analogue computing unit 210, for instance the processing may operate in processing cycles of a defined duration and to avoid artefacts it may be desirable to complete a correspondingly defined number of processing cycles. The duration of the second time period may therefore be set to allow a defined number of processing cycles to be completed during the period in which data processing is enabled.

As also noted above, the voltage droop during the second time period may mean that, when cyclic regulation is restarted, it may take a number of regulator cycles for the voltage $V_{COMP}$ to return to the nominal voltage level. The duration of the first time period may therefore be set so as to allow sufficient time for the regulated voltage $V_{COMP}$ to return to the nominal voltage level, and possibly stabilise at such a level, even in the worst case expected operating conditions, before another instance of the second time period, i.e. before another instance of operation of the voltage regulator in the second mode.

In some embodiments however the duration of at least one of the first time periods $T_1$ and the second time periods $T_2$ may be variable. With reference to FIG. 6c, during the first time period $T_1$ with the controller 230 operating the voltage regulator unit 220 in the first mode, the controller 230 may be configured to compare an indication of the magnitude of the voltage $V_{COMP}$ to a first threshold $V_{TH1}$, which may be a relatively high threshold indicating that the regulated voltage $V_{COMP}$ is sufficiently high so as to allow an instance of a second time period. In some implementations the controller 230 may switch the voltage regulator 220 to the second mode if the indication of the magnitude of the voltage $V_{COMP}$ crosses the first threshold $V_{TH1}$. In some examples the controller 230 may therefore receive an indication of the magnitude of the voltage $V_{COMP}$ and compare it to a threshold, or the regulator 220 or analogue compute unit 210 may determine if the voltage $V_{COMP}$ is above the threshold and provide a signal to the controller 230. The duration of the first time period $T_1$, is thus variable based on how long it takes the voltage Vamp to increase from the level at the start of the first time period to the level of the first threshold.

Additionally or alternatively, in some embodiments, when the voltage regulator 220 is operating in the second mode of operation, the controller 230 may be configured to compare an indication of the magnitude of the voltage $V_{COMP}$ to a second voltage threshold $V_{TH2}$, and to switch to the first mode if the indication of the magnitude of the voltage $V_{COMP}$ crosses the second threshold value $V_{TH2}$. The second threshold may be a lower threshold indicative of a minimum acceptable voltage level for the voltage $V_{COMP}$. As discussed above, the controller 230 may be configured to receive an indication of the magnitude of the voltage $V_{COMP}$ and compare it with the second voltage threshold $V_{TH2}$. In some implementations, when the comparison indicates that the magnitude has crossed the second voltage threshold $V_{TH2}$, the controller 230 may be configured to switch operation of the voltage regulator 220 from the second mode to the first mode of operation. In some instances however the controller 230 may be configured so that the analogue computing unit 210 can complete a processing cycle before switching to the first mode of operation, and the second threshold may be set accordingly. Thus the duration of the second time period $T_2$ may be variable based on the rate of droop of the voltage $V_{COMP}$.

In some embodiments the first voltage threshold value $V_{TH1}$ and the second voltage threshold value $V_{TH2}$ may be predefined. In some embodiments however at least one of the first voltage threshold value $V_{TH1}$ and the second voltage threshold value $V_{TH2}$ may be variable, for example based on operating conditions such as temperature. Temperature may affect the performance of an analogue system in a variety of ways.

Therefore the controller 230 may receive a measure of the temperature of the analogue computing circuitry 200 and vary at least one of the first voltage threshold value $V_{TH1}$ and the second voltage threshold value $V_{TH2}$ based on this measure.

Figure 6B:
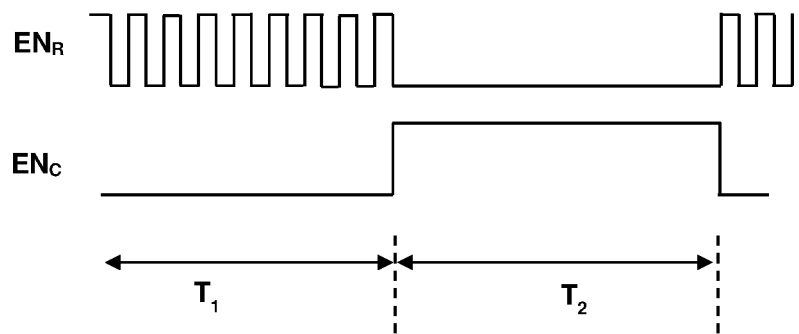
Figure 6C:
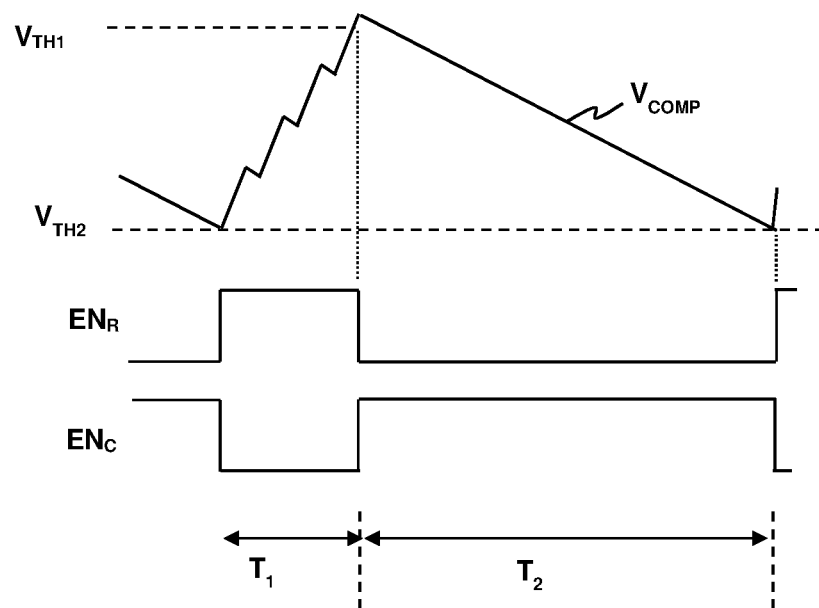

It will of course be understood that the waveforms illustrated in FIGS. 6a, 6b and 6c are for the purposes of explanation only to illustrate the principles of operation and the actual waveforms that would be seen in use may be quite different. For instance the relative durations of the first and/or second time periods with respect to the regulation cycle period illustrated in FIG. 6a or the clock period illustrated in FIG. 6b may be quite different in practice. Likewise the form of the voltage ripple and/or the relative magnitude of the voltage ripple compared to the voltage droop during the second period may quite different in practice.

Some embodiments thus relate to computing circuitry comprising an analogue computing unit for processing data and a voltage regulator for providing at least one voltage to the analogue computing unit. The computing circuitry is configured to periodically suspend active voltage regulation by the voltage regulator and to operate the analogue computing unit to process data during a period in which active voltage regulation is suspended. This mitigates the risks of a voltage ripple associated with active voltage regulation from causing artefacts in the data processing.

Figure 7:
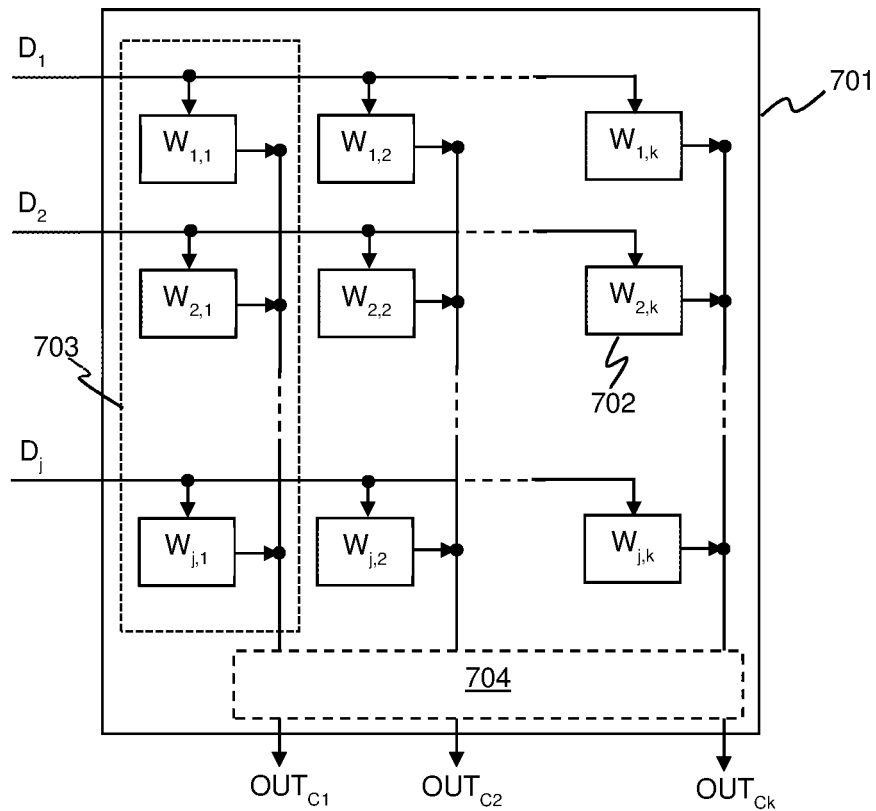
FIG. 7 illustrates one example of an analogue computing array.

The analogue computation unit 210 may comprise a plurality of computing or processing cells and may be configured to perform particular calculations, for instance to implement a dot product engine. For example, FIG. 7 illustrates, in a generalised form, one example of a computing array 701 which may form at least part of the analogue computation unit 210. FIG. 7 illustrates that the array 701 may comprise a plurality of processing cells 702. Each processing cell 702 may comprise circuitry such as described with reference to FIG. 1, e.g. circuitry 100a or 100b or other similar circuitry. The example array of FIG. 7 is formed as a crossbar type array. The array 701 in this example has j rows for receiving a data vector with j data variables. The relevant input data for each row is supplied to each of the k processing cells 702 of that row. In the example of FIG. 7 the array 701 is also arranged in a plurality of columns 703, and the output of each individual processing cell 702 in a column is combined to form a weighted data combination. In some implementations the weighted data combination for each column could be provided as a respective output variable, $OUT_{C1}$, of an output vector (e.g. $OUT_{UN}$), however in some embodiments there may be some additional processing, such as processing according to a non-linear function and/or conversion to a digital output by processing block 704. In some implementations there may be a plurality of such processing arrays 701 and, in some examples, at least some processing arrays could be arranged as processing nodes in a series of layers such that some processing arrays operate to process data which is output from one more arrays of a preceding layer.

In some implementations, to process data the analogue computing unit 210 is enabled to perform data processing and substantially all of the analogue computing unit 210 may be activated and used to process data. In some embodiments however the analogue computing unit 210 may comprise a plurality of processing sub-units or modules which may be selectively enabled to perform processing and the computing circuitry 200 may be configured so that not all of the processing sub-units or modules are used for processing data during a given time period.

Figure 8:
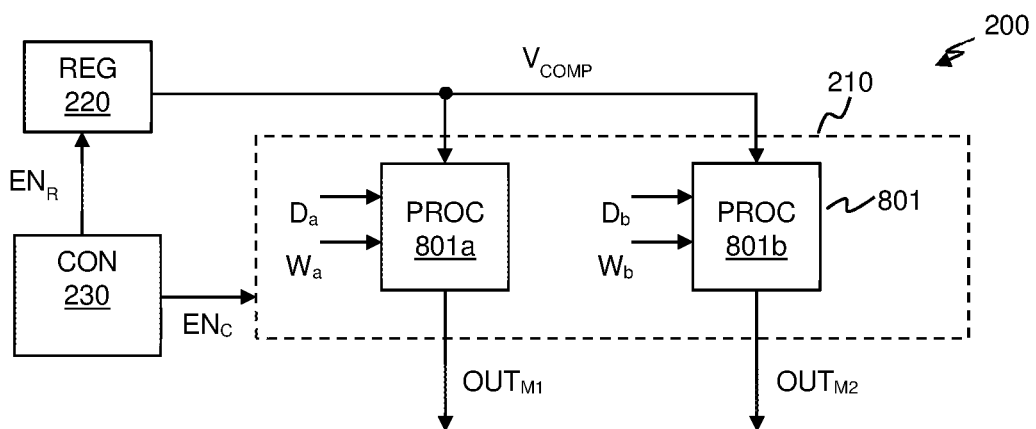
FIG. 8 illustrates a computation unit with two processing modules.

For example, FIG. 8 illustrates an example of computing circuitry 200 with an analogue computation unit 210 having a plurality of computation sub-units or processing modules 801. FIG. 8 shows just two such processing modules 801a and 801b for clarity but it will be appreciated that there may be more processing modules in practice. Each processing module 801 may, for example, comprise a separate processing array 701 such as illustrated in FIG. 7.

As noted above, at least some ANNs may be implemented with a plurality of layers, with a succeeding layer processing data from a preceding layer. Each layer may require one or more processing arrays. Also, it will be appreciated that, in practice, a processing array 701 will be implemented with a fixed number of processing elements, e.g. a fixed number of rows and columns. This number may be chosen with respect to the expected size of the weight matrix and input and output vectors. However there may be a practical limit to the number of processing elements in a row or column and it may be the case that, in some instances it may not be possible to implement a desired calculation using a single processing array and the calculation may need to be split over separate processing arrays. In any event, the analogue computing circuitry 200 may comprise a plurality of processing arrays. It may be advantageous for the same voltage regulator 220 to regulate and supply voltages for multiple different processing arrays, as otherwise each processing array may require its own voltage regulator which may increase the size of the circuitry and possibly lead to additional problems of mismatch.

Figure 9A:
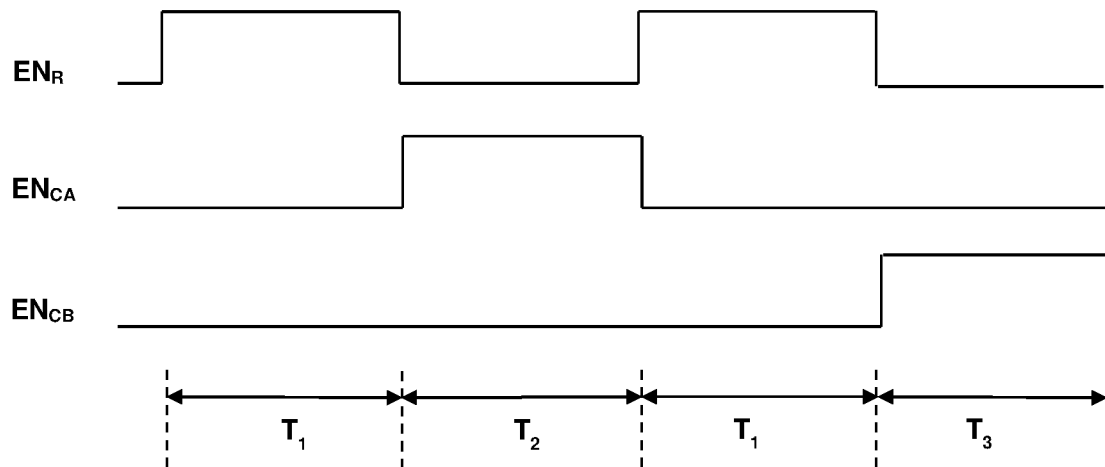
FIGS. 9a and 9b illustrate further examples of timing diagrams for waveforms that may be suitable for the computing unit of FIG. 8.

In such case, the computing circuitry 200 may be operable such that not all of the processing modules that receive voltages from the same voltage regulator are enabled for data processing at the same time. FIG. 9a illustrates an example timing diagram that may be implemented for analogue computing circuitry 200 illustrated in FIG. 8. FIG. 9a illustrates that the controller 230 may generate a regulator control signal $EN_R$ in a similar fashion as described above, but in this example the compute control signal $EN_C$ comprises separate control signals $EN_{CA}$ and $EN_{CB}$ for controlling the first and second processing modules 801a and 801b respectively.

As discussed above, the controller 230 may be configured to operate the voltage regulator 220 in the first mode by cyclically operating the voltage regulator through a plurality of phases to cyclically regulate the voltage $V_{COMP}$ during a first time period $T_1$. Active regulation by the voltage regulator 220 introduces a voltage ripple $V_{RIPPLE}$ into the voltage $V_{COMP}$ which could cause errors and artefacts in the data processing of data by the analogue computing unit. Therefore, when the voltage regulator 220 is operating in the first mode, the controller 230 controls both the first processing module 801a and the second processing module 801b to disable processing of data.

When there is data to be processed, and the first voltage $V_{COMP}$ is sufficiently high, the controller 230 may switch operation of the voltage regulator 220 to the second mode to suspend active regulation of the voltage $V_{COMP}$, and may start a compute period to enable data processing by the analogue compute unit 210. However in the example of FIG. 9a the first and second processing modules 801a and 801b are not enabled simultaneously.

Thus, during a second time period $T_2$, with active regulation of the voltage $V_{COMP}$ suspended, the controller 230 enables the first processing module 801a to process data, but maintains the second processing module 801b in the suspended state of operation. In the example of FIG. 9a the first compute control signal $EN_{CA}$ thus goes high during the second time period $T_2$, but the second compute enable signal $EN_{CB}$ remains in the low state.

Separately, during a third time period $T_3$, with active regulation of the voltage $V_{COMP}$ suspended, the controller 230 enables the second processing module 801b to process data whilst operation of the first processing module 801a is suspended.

Only enabling and operating some of the processing modules at a time (in this example just one of the processing modules 801a and 801b) may reduce the instantaneous load current drawn by the analogue computing unit at any time, and thus the rate of voltage droop, compared to enabling all of the processing modules (in this example both processing modules 801a and 801b). This may mean that the voltage droop over a processing cycle is lower, which may be advantageous in reducing errors and/or being easier to compensate for, and/or it may allow a longer time for a computing cycle whilst remaining within an acceptable limit of droop.

In some implementations, an instance of the second time period may be immediately followed by an instance of the third time period. However in such a case, at the start of the third time period $T_3$ the voltage $V_{COMP}$ would exhibit the droop that occurred during the second time period $T_2$. This may still be advantageous as the rate of the change, and overall magnitude of change, over the third time period may be reduced compared to both processing modules being enabled at the same time.

However, advantageously the controller 230 may be configured such that an instance of the second time period $T_2$ and an instance of the third time period $T_3$ are interspersed by an additional instance of first time period $T_1$, during which the voltage regulator 220 actively regulates the voltage $V_{COMP}$ Thus, in the example illustrated in FIG. 9a, following the end of the second time period $T_2$, active voltage regulation of the voltage $V_{COMP}$ is re-enabled and the voltage regulator 220 may restore the voltage $V_{COMP}$ to the nominal voltage before the third time period.

Thus, the controller 230 may be configured to control operation of the voltage regulator unit in the first mode during a plurality of first time periods $T_1$ interspersed with operation in the second mode during a plurality of compute time periods, e.g. second time period $T_2$ and third time period $T_3$. During each of the compute time periods the controller 230 may be configured to enable data processing in one or more processing modules but suspend data processing in one or more other processing modules. The controller may be configured to enable processing of the processing modules in different computing periods according to some sequence. For instance processing modules associated with a layer of an ANN may be enabled in one or more computing periods before enabling processing modules associated with a subsequent layer in one or more subsequent computing periods. In some embodiments the controller 230 may be configured to operate such that there is at least one instance of a first time period $T_1$ of operation, with active voltage regulation enabled, between successive instances of compute time periods, with active voltage regulation suspended.

Figure 9B:
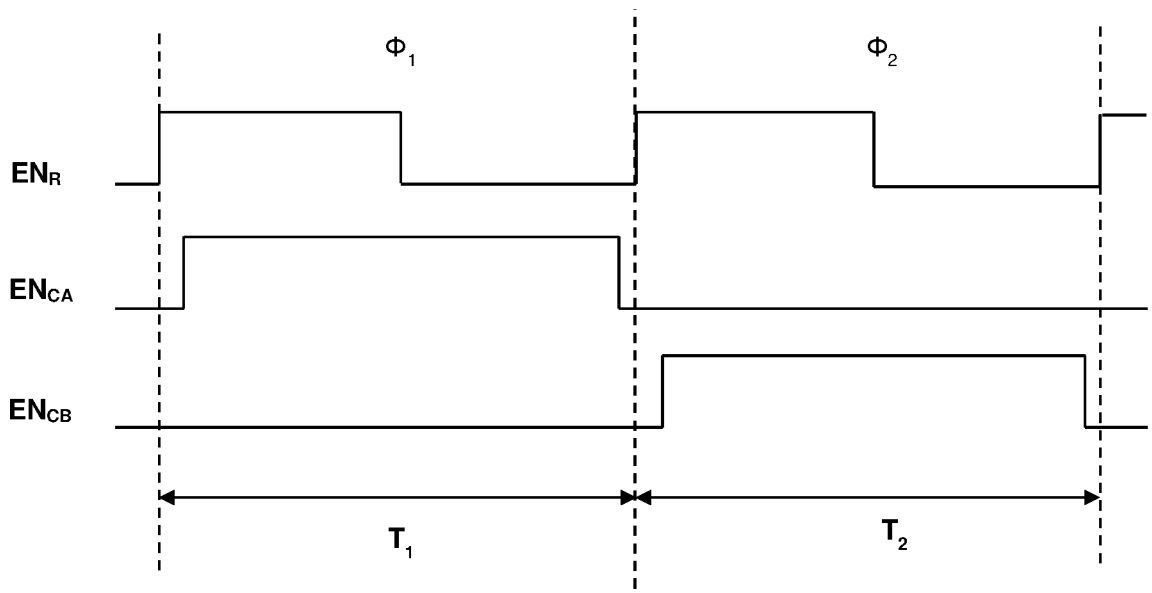

FIG. 9b illustrates another example timing diagram that may be implemented for analogue computing circuitry 200 illustrated in FIG. 8. In the example of FIG. 9b, the voltage regulator 220 may comprise a two-phase DC-DC converter, which may operate in a similar fashion as described above. According to some embodiments, controller 230 may operate one of the processing modules of analogue computation unit 210 to process data during one phase of operation of voltage regulator 220 and operate another one of the processing modules of analogue computation unit 210 to process data during another phase of operation of the voltage regulator 220.

In the first period $T_1$, the voltage regulator 220 may operate in the first phase $\phi_1$, for a duration corresponding to one clock period of the regulator control signal $EN_R$. During the first period $T_1$, controller 230 may operate first processing module 801a to process data by configuring first compute control signal $EN_{CA}$ in the high state. The controller 230 may also suspend the second processing module 801b from processing data during the first time period by configuring second compute control signal $EN_{CB}$ in the low state. As discussed in relation to FIG. 4a-c, controller 230 may control analogue computation unit 210 to avoid any data processing during a period in which the voltage regulator 220 is undergoing a phase transition, due to the variation in voltage $V_{COMP}$ that can occur during said transitions. As such, as the voltage regulator 220 transitions from the first phase $\phi_1$ to the second phase $\phi_2$, controller 230 may suspend first processing module 801a and second processing module 801b from processing data.

During the second time period $T_2$ with voltage regulator 220 configured in the second phase $\phi_2$, controller 230 may then operate second processing module 801b to process data by configuring the second compute control signal $EN_{CB}$ in the high state. The controller 230 also suspends first processing module 801a from processing data during the second time period $T_2$ by controlling first compute control signal $EN_{CA}$ in the low state.

Therefore in some embodiments during a period $T_1$ in which the voltage regulator 220 is operating in a first phase $\phi_1$ of a plurality of phases, the controller 230 may be configured to operate the first processing module 801a to process data and to suspend the second processing module 801b from processing data and during a period 12 in which the voltage regulator 220 is operating in a second phase $\phi_1$ of the plurality of phases the controller 230 may be configured to operate the second processing module 801b to process data and to suspend the first processing module 801a from processing data.

It should be noted that the discussion above has focused on processing modules 801 such as different processing arrays. In some embodiments however different processing modules could comprise different parts of the same processing array. For example referring back to FIG. 7, in some implementations it may be possible to operate the various processing cells in one or more columns 703 of the array separately from other columns of the array. In some implementations this may allow various components to be shared between the various columns in a time-division manner, which may be advantageous in terms of size and consistency. In such a case a processing module could comprise one or more, but not all, columns of the array, i.e. a subset of the array. More generally a processing module may be implemented by any group of processing circuitry which can be operated separately by another group.

As discussed above, by periodically operating the voltage regulator 220 in the second mode of operation, with active cyclic regulation of the voltage $V_{COMP}$ suspended, and operating, at least part of, the analogue computing unit 210 to perform data processing during a period in which voltage regulation is suspended, the problem of voltage ripple causing artefacts in the processing may be avoided. However the voltage droop that occurs when the voltage $V_{COMP}$ is not being actively regulated may result in errors in the processing, for instance in some implementations the voltage droop may result in a variation in gain. Similarly, operating the voltage regulator 220 to suspend regulation of the voltage $V_{COMP}$ and maintaining the voltage regulator 220 in one phase of operation, for the analogue computation unit 210 to complete a processing operation, such as that described in relation to FIG. 5, may also result in an excessive droop which may cause errors in processing. In some embodiments the computing circuitry may be configured to at least partly compensate or correct for the voltage droop that occurs. In some embodiments the computing circuitry may therefore comprise a correction or compensation module.

Figure 10:
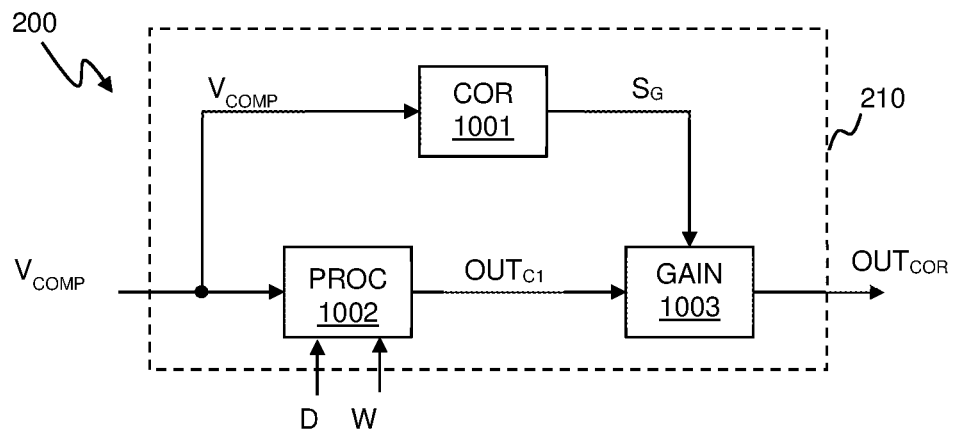
FIG. 10 illustrates an analogue computing unit with compensation for voltage droop.

FIG. 10 illustrates an example of computation circuitry 200 according to an embodiment. The computing circuitry 200 comprises an analogue computation unit 210 such as described above, but in this example the analogue computation unit 210 includes a correction module 1001 for applying a correction due to voltage droop on the voltage $V_{COMP}$.

In the example of FIG. 10 the correction is applied to the output of a processing block 1002, where the output of the processing block is proportional to the voltage $V_{COMP}$. For example, referring back to FIG. 1 and the discussion thereof, it will be understood that the processing circuitry illustrated will generate an output signal which is a current signal with an average magnitude proportional to the input data value D1 and the relevant weight value W1, however the output current may also be proportional to the voltage $V_{COMP}$. Any variation in the voltage $V_{COMP}$ will thus appear as a gain variation affecting the output signal. Referring to FIG. 7, it will be understood that the outputs of a plurality of processing cells may be combined together, for instance FIG. 7 illustrates that the outputs from a column 703 of processing cells 702 may be combined. If each processing cell 702 in the column has the same general structure and receives the same voltage $V_{COMP}$ (not illustrated in FIG. 10) the combined output will also thus be proportional to the voltage $V_{COMP}$. In some instances therefore the processing block 1002 to which compensation is applied may be group of processing cells whose analogue outputs are combined to form a combined output $OUT_{C1}$.

In such an implementation, as a variation in the voltage $V_{COMP}$ manifests as a gain change, a correction may be applied by varying a gain applied by an element 1003 having a variable gain. The correction module 1001 may thus receive an indication of the voltage $V_{COMP}$ and generate a suitable gain control signal $S_G$ for controlling the gain of the variable gain element 1003, so as to provide a corrected output $OUT_{COR}$.

In some embodiments the processing block 1002 may output a digital output signal, e.g. referring back to FIG. 7 the output of a column 703 of processing cells 702 may be converted to digital by processing block 704. In which case the variable gain element 1003 may be a digital gain element and the correction module 1001 may determine a suitable gain value to be applied based on the voltage $V_{COMP}$ In some embodiments however the output of processing block 1002 may be an analogue signal and the gain element may be an element for applying a variable gain to a received analogue input.

In some implementations the gain element 1003 may be an analogue-to-digital converter (ADC). The voltage $V_{COMP}$ may be used to define a reference for the ADC 1003, for example the correction module 1001 may simply be an element with a defined resistance or conductance, so that the gain control signal $S_G$ is a current reference that varies with $V_{COMP}$ in a similar fashion to the output of the processing block 1002. The ADC 1003 may convert the output OUT from the processing block 1002, based on the reference current $S_G$, to provide a digital output $OUT_{COR}$ which is substantially corrected from any variation in $V_{COMP}$.

In some embodiments the gain element 1003 may comprise an ADC comprising a PWM encoder. The gain may therefore be adjusted so as to be proportional to the variation in the voltage $V_{COMP}$ by adjusting the cycle period of the PWM encoder, for example by suitably adjusting the ramp rate or amplitude of a reference waveform within the PWM encoder.

In some embodiments the gain element 1003 may comprise a function unit for applying a desired function e.g. a non-linear activation function, to the output of the processing block. As one skilled in the art will be familiar with, an ANN may be capable of computing linearly non-separable functions using a non-linear functions. Each processing module may comprise a plurality of inputs configured to receive a plurality of data input values and perform a complex computing function. The combined output $OUT_{C1}$ may comprise the sum of each of the processing modules, e.g. the dot product of an input data vector with a respective weight vector. With a non-linear ANN architecture, the combined output $OUT_{C1}$ is provided to a function unit where a non-linear transfer function is applied to the combined output $OUT_{C1}$. In such embodiments, the gain to be applied from correction module 1001 may be provided by adjusting a reference waveform for the non-linear transfer function.

Figure 11:
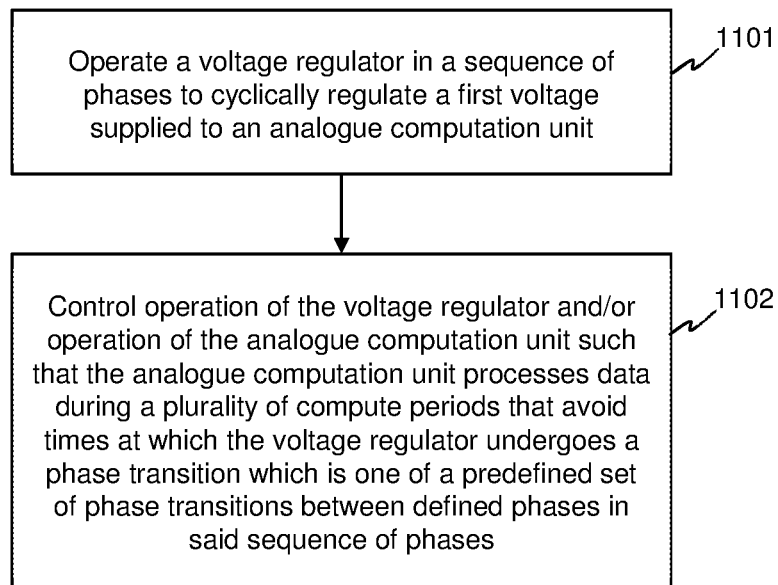
FIG. 11 illustrates an example flowchart of a method of operating computing.

FIG. 11 illustrates a flow chart of a method of operating computing circuitry according to an embodiment, where the computing circuitry has an analogue computing unit and a voltage regulator for supplying a voltage to the analogue computing unit. The method involves the step 1101 of operating the voltage regulator in a sequence of phases to cyclically regulate the first voltage supplied to the analogue computation unit. The method further comprises, the step 1102 of control operation of the voltage regulator and/or operation of the analogue computation unit such that the analogue computation unit processes data during a plurality of compute periods that avoid times at which the voltage regulator undergoes a phase transition which is one of a predefined set of phase transitions between defined phases in said sequence of phases.

A circuit according to an embodiment of the present invention may be implemented as an integrated circuit.

Computing circuitry according to the present embodiments may be relatively low power. Because of the ability for parallel processing of data without the need for multiple memory reads and memory writes the computing circuitry may be operable with relatively low latency, which may be particularly suitable for some applications, such as speech or speaker recognition for example.

Figure 12:
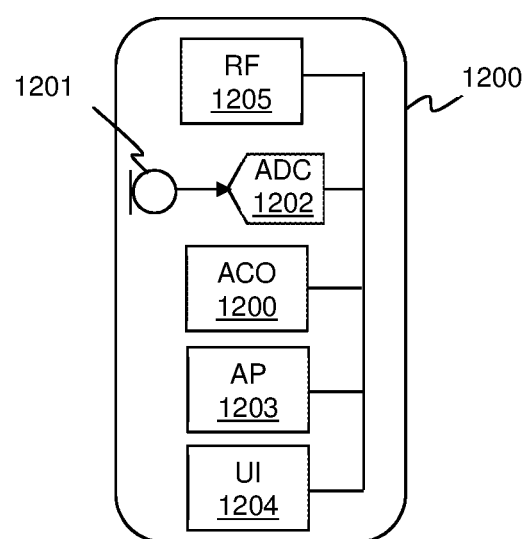
FIG. 12 illustrates an example of an electronic device with analogue computing circuitry.

Embodiments of the present invention may be implemented in an electronic device, especially a portable and/or battery powered device, and in particular may be implemented in a so-called edge device to enable edge computing. FIG. 12 illustrates an electronic device 1200 comprising a computing circuit 200 such as described above. The electronic device may be a portable or battery powered device, for instance a tablet or laptop computer, or smartphone or smartwatch or the like, or a communications interface device such as a smart speaker or other smart listening device. The device may, in some instance, be a voice controlled or voice activated device. The device could be a domestic appliance. The device may have a microphone 1201 and an ADC 1202. In some instances the computing circuit may be operable to process audio data received via the microphone, e.g. for speech and/or speaker recognition. The device may comprise an applications processor (AP) 1203 and in some implementations the computing circuitry may be operable to process data received from the AP and/or to provide data to the AP. In some instances the operation of the computing circuit 200 may be configured by the AP 1203 in use. The device may have at least one other user interface 1204, e.g. for allowing text input and in some applications the computing circuit 200 may be operable to process data received via the UI 1004. The electronic device may also comprise an RF unit 1205 for sending and receiving data wirelessly, e.g. via WiFi™ or Bluetooth™. The computing circuitry 200 may be operable to process data received via the RF unit 1205 and/or to provide data to the RF unit 1005 for broadcast. In some embodiments weight values to be stored in memory of the analogue computing circuitry may be received or updated via the RF unit 1205.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in the claim, "a" or "an" does not exclude a plurality, and a single feature or other unit may fulfil the functions of several units recited in the claims. Any reference numerals or labels in the claims shall not be construed so as to limit their scope. Terms such as amplify or gain include possibly applying a scaling factor or less than unity to a signal.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Computing circuitry, comprising:
   a computation unit for processing data, wherein the computation unit is configured to receive a supply voltage that exhibits a voltage ripple with a plurality of rise periods of voltage rise interspersed with a plurality of droop periods of voltage droop; and
   a controller configured to control operation of the computing circuitry such that the computation unit processes data during a plurality of compute periods that occur during said during droop periods and do not overlap with said rise periods.

2. The computing circuitry of claim 1 wherein the controller is configured to suspend the computation unit from processing data during said plurality of rise periods.

3. The computing circuitry of claim 1 wherein the controller is configured to control operation of the analogue computation unit to start and end each compute period during a respective one of said plurality of droop periods.

4. The computing circuitry of claim 1 further comprising a voltage regulator for providing said supply voltage to the computation unit, wherein said voltage ripple is generated by the operation of the voltage regulator.

5. The computing circuitry of claim 4 wherein the controller is configured to be operable to control the voltage regulator so as to extend a droop period so as to allow time for a compute period to be completed.

6. The computing circuitry of claim 5 wherein the computation unit is configured to provide a computation status to the controller indicative of whether computing may be suspended and the controller is configured to control operation of the voltage regulator so as to extend a droop period based on the computation status.

7. The computing circuitry of claim 4 wherein the voltage regulator is configured to cycle through a series of phase to generate said supply voltage, wherein each rise period corresponds to the voltage regulator operating in one or more of a first set of phases and each droop period corresponds to the voltage regulator operating in one or more of a second, different, set of phases.

8. The computing circuitry of claim 7 wherein the controller is configured to be operable to control the voltage regulator so as to delay the voltage regulator from transitioning to one of the first set of phases so as to allow time for a compute period to be completed.

9. The computing circuitry of claim 7 wherein the voltage regulator is configured to provide a regulator status to the controller indicative that the voltage regulator is undergoing or is about to undergo a phase transition from a phase in the second set to a phase in the first set and the controller is configured to control the operation of the voltage regulator and/or the operation of the computing unit based, at least partly, on said regulator status.

10. The computing circuitry of claim 4 wherein the controller is configured to control the voltage regulator to operate in a first mode in which the supply voltage is regulated to have rise period and droop period with a first frequency, and in a second mode where one of said droop periods has an extended duration so that at least some compute periods occur when the voltage regulator is operating in the second mode.

11. The computing circuitry of claim 10 wherein the controller is configured to repeatedly control operation of the voltage regulator in the first mode during a plurality of first mode time periods interspersed with operation of the voltage regulator in the second mode during a plurality of second mode time periods.

12. The computing circuitry of claim 11 wherein the duration of at least one of the first mode time periods and the second mode time periods is variable.

13. The computing circuitry of claim 12 wherein, in the first mode of operation of the voltage regulator, the controller is configured to compare an indication of the magnitude of the supply voltage to a first threshold and to switch to the second mode if the indication of the magnitude of the supply voltage crosses the first threshold.

14. The computing circuitry of claim 13 wherein, in the second mode of operation of the voltage regulator, the controller is configured to compare an indication of the magnitude of the supply voltage to a second threshold and to switch to the first mode if the indication of the magnitude of the supply voltage crosses the second threshold value.

15. The computing circuitry of claim 4 wherein the voltage regulator comprises at least one of:
   a DC-DC converter; a charge pump; or a buck or boost converter.

16. The computing circuitry of claim 1 wherein the computation unit comprises an analogue computation unit.

17. The computing circuitry of claim 16 wherein the analogue computation unit comprises a compensation module configured to apply a compensation for voltage droop of the supply voltage during the droop period.

18. The computing circuitry of claim 16 wherein the analogue computation unit comprises at least part of an inference circuit for an artificial neural network.

19. Computing circuitry, comprising:
   a computation unit for processing data, wherein the computation unit is configured to receive a first voltage that exhibits a voltage ripple with a cyclic voltage ramp-up followed by a voltage droop; and
   a controller configured to control operation of the computing circuitry such that the computation unit processes data during a plurality of compute periods that occur only during periods of voltage droop in the first voltage.

20. Computing circuitry, comprising:
   a computation unit for processing data, wherein the computation unit is configured to receive a supply voltage that exhibits a cyclic voltage ramp-up, wherein the computation unit is configured to processes data during a plurality of compute periods that avoid said periods in which the voltage ramp-up occurs.

* * * * *

UNITED STATES PATENT AND TRADEMARK OFFICE
CERTIFICATE OF CORRECTION

PATENT NO. : 11,880,728 B2
APPLICATION NO. : 18/296297
DATED : January 23, 2024
INVENTOR(S) : John Paul Lesso It is certified that error appears in the above-identified patent and that said Letters Patent is hereby corrected as shown below:

In the Specification

1. In Column 7, Line 66, delete "vector of j" and insert -- vector $D_j$ of j --, therefor.

2. In Column 8, Line 21, delete "vector by" and insert -- vector $D_j$ by --, therefor.

3. In Column 15, Line 27, delete "$V_{COMP}$" and insert -- $V_{COMP.}$ --, therefor.

4. In Column 16, Line 11, delete "T." and insert -- $\Delta T$. --, therefor.

5. In Column 17, Line 59, delete "$V_{COMP}$" and insert -- $V_{COMP.}$ --, therefor.

6. In Column 18, Line 5, delete "$V_{COMP}$" and insert -- $V_{COMP.}$ --, therefor.

7. In Column 18, Lines 31-32, delete "of the voltage $V_{COMP}$" and insert -- of the voltage $V_{COMP.}$ --, therefor.

8. In Column 18, Line 65, delete "$V_{COMP}$" and insert -- $V_{COMP.}$ --, therefor.

9. In Column 20, Line 33, delete "period 12," and insert -- period $T_2$, --, therefor.

10. In Column 20, Line 40, delete "period 12" and insert -- period $T_2$ --, therefor.

11. In Column 20, Line 63, delete "period 12." and insert -- period $T_2$. --, therefor.

12. In Column 20, Line 66, delete "period 12" and insert -- period $T_2$ --, therefor.

13. In Column 22, Line 60, delete "Vamp" and insert -- $V_{COMP}$ --, therefor.

14. In Column 25, Line 60, delete "$V_{COMP}$" and insert -- $V_{COMP.}$ --, therefor.

Signed and Sealed this
Twenty-second Day of October, 2024

Katherine Kelly Vidal
*Director of the United States Patent and Trademark Office*

CERTIFICATE OF CORRECTION (continued)
U.S. Pat. No. 11,880,728 B2

15. In Column 26, Line 62, delete "period 12" and insert -- period $T_2$ --, therefor.

16. In Column 28, Line 15, delete "$V_{COMP}$" and insert -- $V_{COMP}$. --, therefor.